(12) United States Patent
Weng

(10) Patent No.: US 12,355,420 B2
(45) Date of Patent: *Jul. 8, 2025

(54) BULK ACOUSTIC WAVE RESONATOR WITH METAL BONDING LAYER

(71) Applicant: Shenzhen Newsonic Technologies Co., Ltd., Shenzhen (CN)

(72) Inventor: Guojun Weng, Shenzhen (CN)

(73) Assignee: Shenzhen Newsonic Technologies Co., Ltd., Shenzhen (CN)

( * ) Notice: Subject to any disclaimer, the term of this patent is extended or adjusted under 35 U.S.C. 154(b) by 409 days.

This patent is subject to a terminal disclaimer.

(21) Appl. No.: 18/058,405

(22) Filed: Nov. 23, 2022

(65) Prior Publication Data
US 2023/0091476 A1 Mar. 23, 2023

(51) Int. Cl.
*H03H 9/02* (2006.01)
*H03H 9/05* (2006.01)

(52) U.S. Cl.
CPC ...... *H03H 9/02015* (2013.01); *H03H 9/0514* (2013.01)

(58) Field of Classification Search
CPC .......... H03H 9/02015; H03H 9/0514
See application file for complete search history.

(56) References Cited

U.S. PATENT DOCUMENTS

2012/0049976 A1 3/2012 Son et al.

FOREIGN PATENT DOCUMENTS

CN 114553163 A 5/2022

OTHER PUBLICATIONS

International Search Report and Written Opinion issued on Mar. 5, 2024, in counterpart International Application No. PCT/IB2023/061697.

*Primary Examiner* — Isam A Alsomiri
*Assistant Examiner* — Abdallah Abulaban
(74) *Attorney, Agent, or Firm* — Finnegan, Henderson, Farabow, Garrett & Dunner, LLP.

(57) ABSTRACT

A bulk acoustic wave (BAW) resonator includes: a substrate; a piezoelectric layer disposed above the substrate; a first electrode disposed below the piezoelectric layer and including a first portion and a second portion spaced apart from each other; a second electrode disposed above the piezoelectric layer; a first dielectric layer, a second dielectric layer, and a third dielectric layer sequentially disposed between the substrate and the piezoelectric layer in an order from the piezoelectric layer to the substrate; a cavity disposed below the first portion of the first electrode; a metal bonding layer disposed between the third dielectric layer and the substrate; and a ground pad metal layer disposed on the piezoelectric layer and electrically connected to the metal bonding layer.

20 Claims, 31 Drawing Sheets

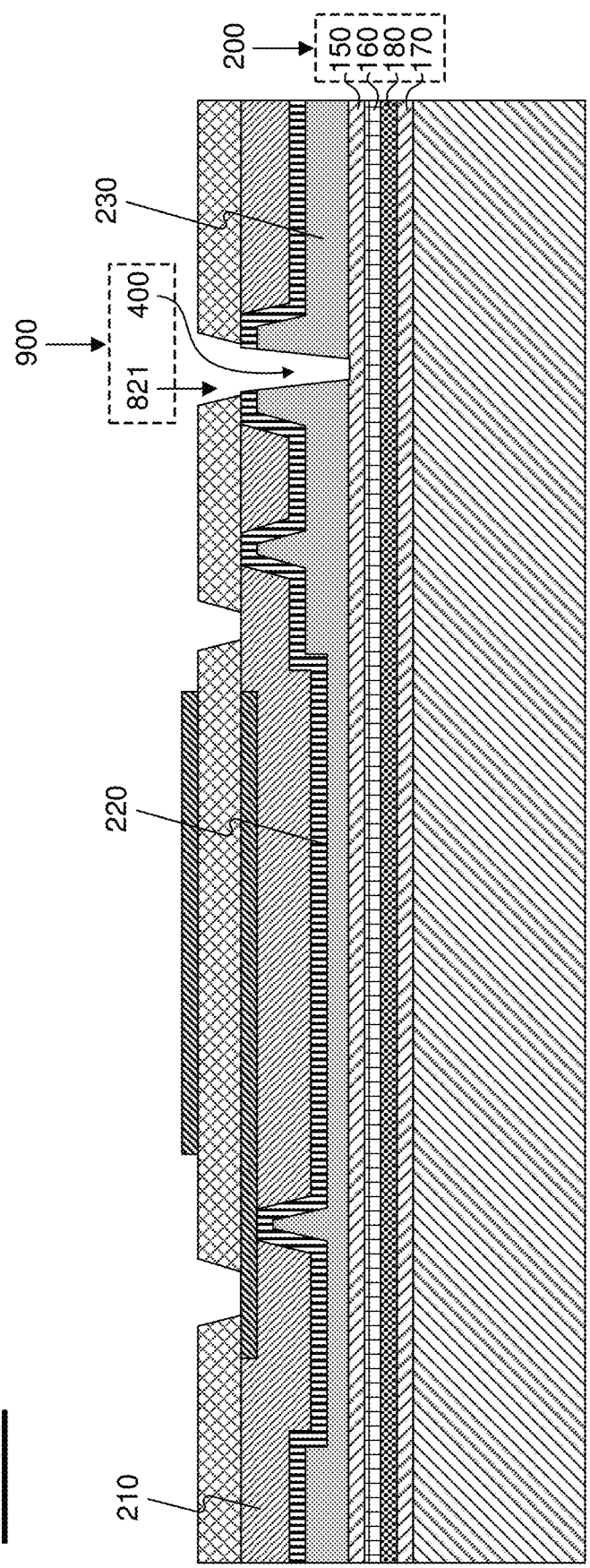

BULK ACOUSTIC WAVE RESONATOR WITH METAL BONDING LAYER

FIELD OF THE DISCLOSURE

The present disclosure relates to the field of semiconductor devices and, in particular, to a bulk acoustic wave (BAW) resonator with a metal bonding layer.

BACKGROUND

A bulk acoustic wave (BAW) resonator is a device including a thin film that is made of a piezoelectric material and disposed between two electrodes. The BAW resonator device is typically fabricated using semiconductor microprocessing technology.

A BAW filter may include two or more BAW resonators. It is desirable to fabricate BAW filters and/or BAW resonators with superior quality and performance.

SUMMARY

According to one aspect of the disclosure, a bulk acoustic wave (BAW) resonator includes a substrate, a piezoelectric layer disposed above the substrate, a first electrode disposed below the piezoelectric layer, and including a first portion and a second portion spaced apart from each other, a second electrode disposed above the piezoelectric layer, a first dielectric layer, a second dielectric layer, and a third dielectric layer sequentially disposed between the substrate and the piezoelectric layer in an order from the piezoelectric layer to the substrate, a cavity disposed below the first portion of the first electrode, a first grounded through hole disposed in the second dielectric layer and the third dielectric layer and exposing a first surface of the second portion of the first electrode, a metal bonding layer disposed between the third dielectric layer and the substrate, with a portion of the metal bonding layer being disposed in the first grounded through hole, a second grounded through hole disposed in the piezoelectric layer and exposing a second surface of the second portion of the first electrode, and a ground pad metal layer disposed on the piezoelectric layer, with a portion of the ground pad metal layer being disposed in the second grounded through hole. The portion of the ground pad metal layer in the second grounded through hole is electrically connected to the portion of the metal bonding layer in the first grounded through hole, via the second portion of the first electrode.

According to another aspect of the disclosure, a bulk acoustic wave (BAW) resonator includes a substrate, a piezoelectric layer disposed above the substrate, a first electrode disposed below the piezoelectric layer, a second electrode disposed above the piezoelectric layer, a first dielectric layer, a second dielectric layer, and a third dielectric layer sequentially disposed between the substrate and the piezoelectric layer in an order from the piezoelectric layer to the substrate, a cavity disposed below the first electrode, a metal bonding layer disposed between the third dielectric layer and the substrate, a grounded through hole disposed in the piezoelectric layer, the second dielectric layer, and the third dielectric layer, and exposing the metal bonding layer, and a ground pad metal layer disposed on the piezoelectric layer and in the grounded through hole, and electrically connected to the metal bonding layer.

BRIEF DESCRIPTION OF THE DRAWINGS

The accompanying drawings, which are incorporated in and constitute a part of this application, illustrate disclosed embodiments and, together with the description, serve to explain the disclosed embodiments.

FIGS. 6A-6F are cross-sectional views of structures formed in the process of FIG. 5, according to an embodiment of the present disclosure.

DETAILED DESCRIPTION

Figure 1A:
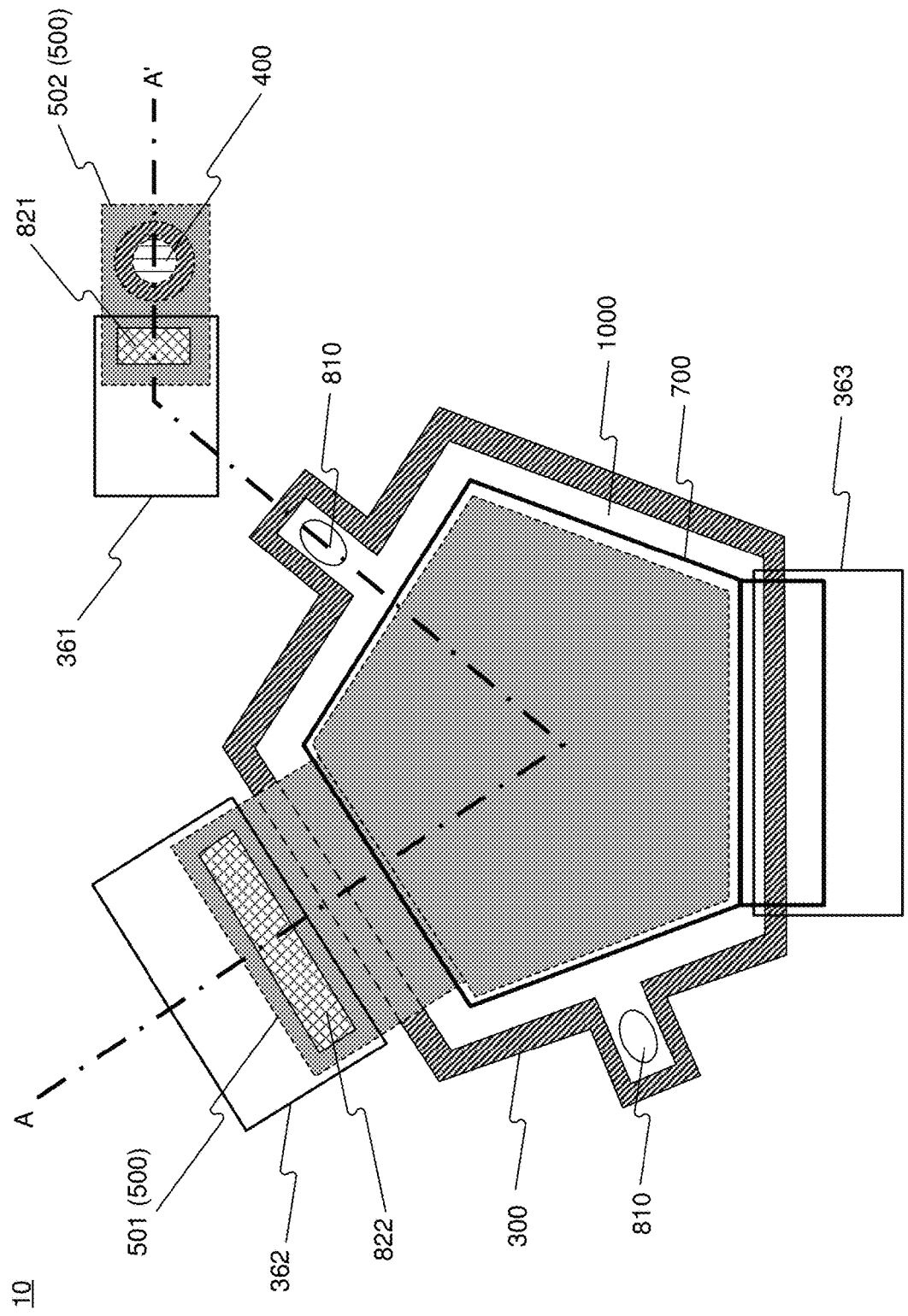
FIG. 1A is a top view showing selected portions of a BAW resonator to be used in a BAW filter, according to an embodiment of the present disclosure.

The text below provides a detailed description of the present disclosure in conjunction with specific embodiments illustrated in the attached drawings. However, these embodiments do not limit the present disclosure. The scope of protection for the present disclosure covers changes made to the structure, method, or function by persons having ordinary skill in the art on the basis of these embodiments.

To facilitate the presentation of the drawings in the present disclosure, the sizes of certain structures or portions may be enlarged relative to other structures or portions. Therefore, the drawings in the present disclosure are only for the purpose of illustrating the basic structure of the subject matter of the present disclosure. The same numbers in different drawings represent the same or similar elements unless otherwise represented.

Additionally, terms in the text indicating relative spatial position, such as "top," "bottom," "upper," "lower," "above," "below," and so forth, are used for explanatory purposes in describing the relationship between a unit or feature depicted in a drawing and another unit or feature therein. Terms indicating relative spatial position may refer to positions other than those depicted in the drawings when a device is being used or operated. For example, if a device shown in a drawing is flipped over, a unit which is described as being positioned "below" or "under" another unit or feature will be located "above" the other unit or feature. Therefore, the illustrative term "below" may include positions both above and below. A device may be oriented in other ways (e.g., rotated 90 degrees or facing another direction), and descriptive terms that appear in the text and are related to space should be interpreted accordingly. When a component or layer is said to be "above" another member or layer or "connected to" another member or layer, it may be directly above the other member or layer or directly connected to the other member or layer, or there may be an intermediate component or layer.

Conventionally, film bulk acoustic resonator (FBAR) and bulk acoustic wave (BAW) structures are manufactured based on bonding processes, most of which are based on $SiO_2$—Si or Si—Si bonding. The $SiO_2$—Si or Si—Si bonding usually has strict requirements on the material, roughness, and warpage of the wafer bonding surface, and the bonding process is difficult and the bonding quality control is not easy. On the other hand, eutectic bonding and metal diffusion bonding do not have strict requirements on bonding conditions, are relatively easy to carry out, and have good bonding quality. However, if a metal bonding layer is used in a BAW resonator, the presence of the metal bonding layer under a cavity of the resonator may negatively influence the performance of the resonator.

In embodiments of the present disclosure, to reduce or eliminate the influence, a metal bonding layer may be grounded. The existence of the metal bonding layer also helps with heat dissipation of a FBAR filter and/or BAW resonator during operation, which is beneficial to the radio frequency power withstand capability of the FBAR filter.

Figure 1B:
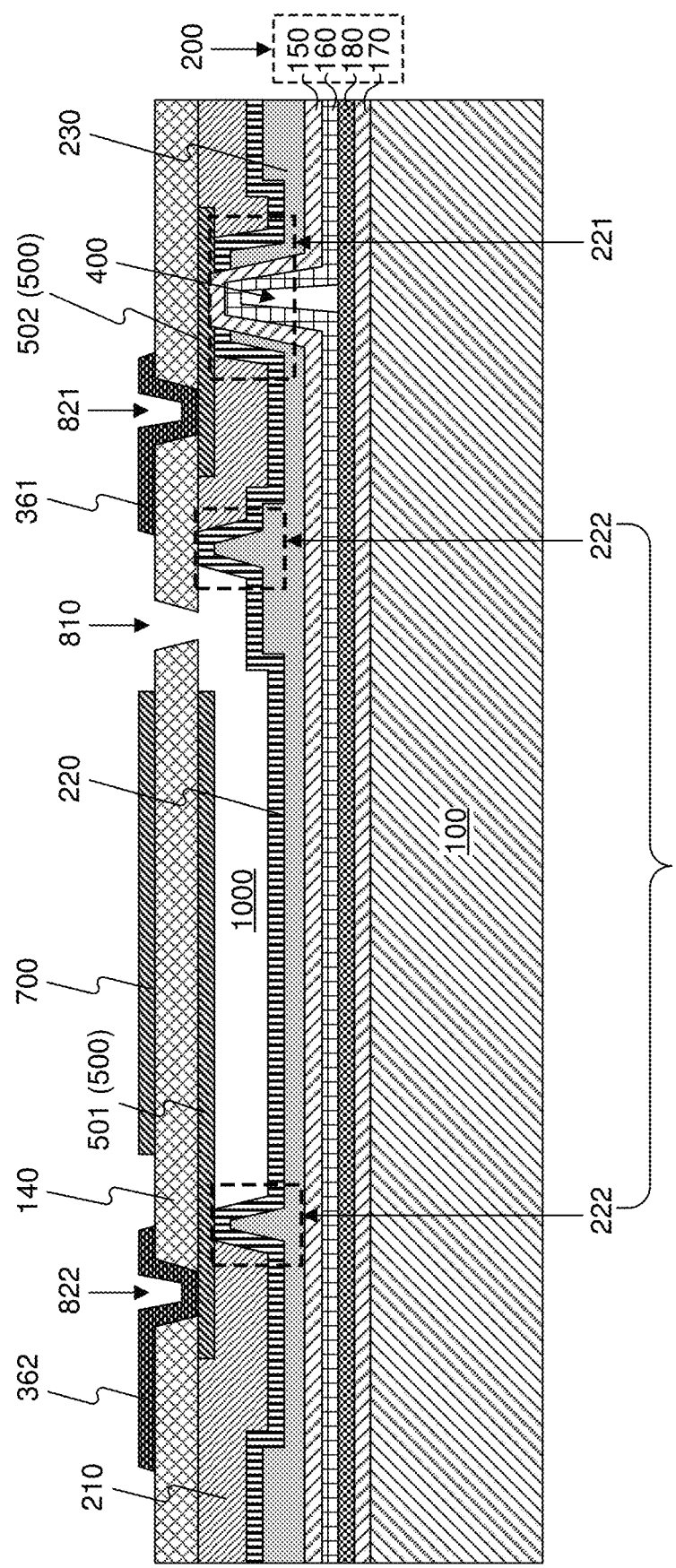
FIG. 1B is a cross-sectional view of the BAW resonator of FIG. 1A, along cross-sectional line A-A' shown in FIG. 1A.

FIG. 1A is a top view showing selected portions of a BAW resonator 10 to be used in a BAW filter, according to an embodiment of the present disclosure. FIG. 1B is a cross-sectional view of the BAW resonator 10 of FIG. 1A, along cross-sectional line A-A' shown in FIG. 1A.

As illustrated in FIGS. 1A and 1B, BAW resonator 10 includes a resonator substrate 100, a piezoelectric layer 140 disposed above resonator substrate 100, a first electrode 500 disposed below piezoelectric layer 140 and including a first portion 501 and a second portion 502 spaced apart from each other, a second electrode 700 disposed above piezoelectric layer 140, a first dielectric layer 210, a second dielectric layer 220, and a third dielectric layer 230 sequentially disposed between resonator substrate 100 and piezoelectric layer 140 in an order from piezoelectric layer 140 to resonator substrate 100, a cavity 1000 disposed below first portion 501 of first electrode 500, and a metal bonding layer 200 disposed between third dielectric layer 230 and resonator substrate 100 and including a first adhesive layer 150, a first bonding layer 160, a second adhesive layer 170, and a second bonding layer 180.

Second dielectric layer 220 includes a first double-wall protruding structure 221 and a second double-wall protruding structure 222 protruding through first dielectric layer 210 toward piezoelectric layer 140. First double-wall protruding structure 221 contacts a first surface (i.e., a bottom surface) of second portion 502 of first electrode 500. Third dielectric layer 230 fills in first double-wall protruding structure 221 and second double-wall protruding structure 222. A first grounded through hole 400 is disposed in first double-wall protruding structure 221 and exposes the first surface of second portion 502 of first electrode 500. First adhesive layer 150 overlays third dielectric layer 230, covers sidewalls and a bottom of first grounded through hole 400, and contacts the first surface of second portion 502 of first electrode 500 via first grounded through hole 400. First bonding layer 160 overlays first adhesive layer 150. Second adhesive layer 170 is disposed on a surface of resonator substrate 100 which faces piezoelectric layer 140. Second bonding layer 180 is disposed on second adhesive layer 170 and bonds to first bonding layer 160 by eutectic bonding or metal diffusion bonding.

A second grounded through hole 821 is disposed in piezoelectric layer 140 and exposes a second surface (i.e., a top surface) of second portion 502 of first electrode 500. Second grounded through hole 821 is not vertically aligned with first grounded through hole 400. That is, the exposed portion of second portion 502 of first electrode 500 exposed by second grounded through hole 821 does not overlap the exposed portion of second portion 502 of first electrode 500 exposed by first grounded through hole 400.

A ground pad metal layer 361 is disposed on piezoelectric layer 140 and in second grounded through hole 821, and contacts the second surface of second portion 502 of first electrode 500 via second grounded through hole 821. Accordingly, a portion of the ground pad metal layer 361 in second grounded through hole 821 is electrically connected to a portion of the metal bonding layer 200 in first grounded through hole 400, via second portion 502 of first electrode 500. A contact hole 822 is disposed in piezoelectric layer 140 and exposes first portion 501 of first electrode 500. A first electrode pad metal layer 362 is disposed on piezoelectric layer 140 and in contact hole 822, and contacts first portion 501 of first electrode 500 via contact hole 822. A second electrode pad metal layer 363 (shown in FIG. 1A) is disposed on piezoelectric layer 140 and contacts and electrically connects to a portion of second electrode 700.

In BAW resonator 10 illustrated in FIGS. 1A and 1B, metal bonding layer 200 including first adhesive layer 150, first bonding layer 160, second adhesive layer 170, and second bonding layer 180, is electrically connected to ground pad metal layer 361 via second portion 502 of first electrode 500. During operation of BAW resonator 10, ground pad metal layer 361 is grounded, and thus metal bonding layer 200 is grounded.

First adhesive layer 150 and second adhesive layer 170 may be formed of one of chromium (Cr), titanium (Ti), titanium nitride (TiN), titanium tungsten (TiW), tantalum (Ta), tantalum nitride (TaN), or a stacked combination of two or more of those materials.

First bonding layer 160 and second bonding layer 180 may be formed of one of gold (Au), copper (Cu), aluminum (Al), indium (In), nickel (Ni), tin (Sn), or a stacked combination of two or more of those materials. First bonding layer 160 and second bonding layer 180 are bonded together via eutectic bonding or metal diffusion bonding.

First dielectric layer 210 may be formed of silicon oxide. First dielectric layer 210 covers a portion of first portion 501 of first electrode 500, second portion 502 of first electrode 500, and a portion of piezoelectric layer 140. The portions of first portion 501 of first electrode 500 and piezoelectric layer 140 not covered by first dielectric layer 210 correspond to cavity 1000 of BAW resonator 10, which is formed by removing a portion of first dielectric layer 210 (referred to as a "sacrificial island") enclosed by second double-wall protruding structure 222 of second dielectric layer 220.

Second dielectric layer 220 may be formed of a non-conductive material that is not corroded by hydrofluoric acid, for example, polysilicon, amorphous silicon, aluminum nitride (AlN), silicon nitride (SiN), tantalum nitride (TaN), gallium nitride (GaN), or a stacked combination of two or more of those materials. Second double-wall protruding structure 222 surrounds cavity 1000, which is a working area of BAW resonator 10 in which first portion 501 of first electrode 500 and second electrode 700 partially overlap. Second double-wall protruding structure 222 contacts a portion of piezoelectric layer 140 and a portion of first portion 501 of first electrode 500.

Third dielectric layer 230 may be formed of silicon oxide, silicon nitride, aluminum nitride, or a stacked combination of two or more of those materials. Third dielectric layer 230 is disposed on a surface of second dielectric layer 220 away from the side facing piezoelectric layer 140. Third dielectric layer 230 fills between the double side walls of first double-wall protruding structure 221 and second double-wall protruding structure 222. The surface of third dielectric layer 230 away from second dielectric layer 220 is planarized to serve as a bonding surface for bonding to resonator substrate 100 via metal bonding layer 200.

Resonator substrate 100 may be formed of silicon, glass (silicon oxide), sapphire (Al$_2$O$_3$), gallium nitride (GaN), silicon carbide (SiC), aluminum nitride (AlN), etc.

Second double-wall protruding structure 222 and the portion of third dielectric layer 230 filling in second double-wall protruding structure 222 constitute a double-wall boundary structure 300 surrounding cavity 1000.

Piezoelectric layer 140 may be formed of AlN or ScAlN. Piezoelectric layer 140 includes one or more release holes 810 that expose cavity 1000.

Figure 2:
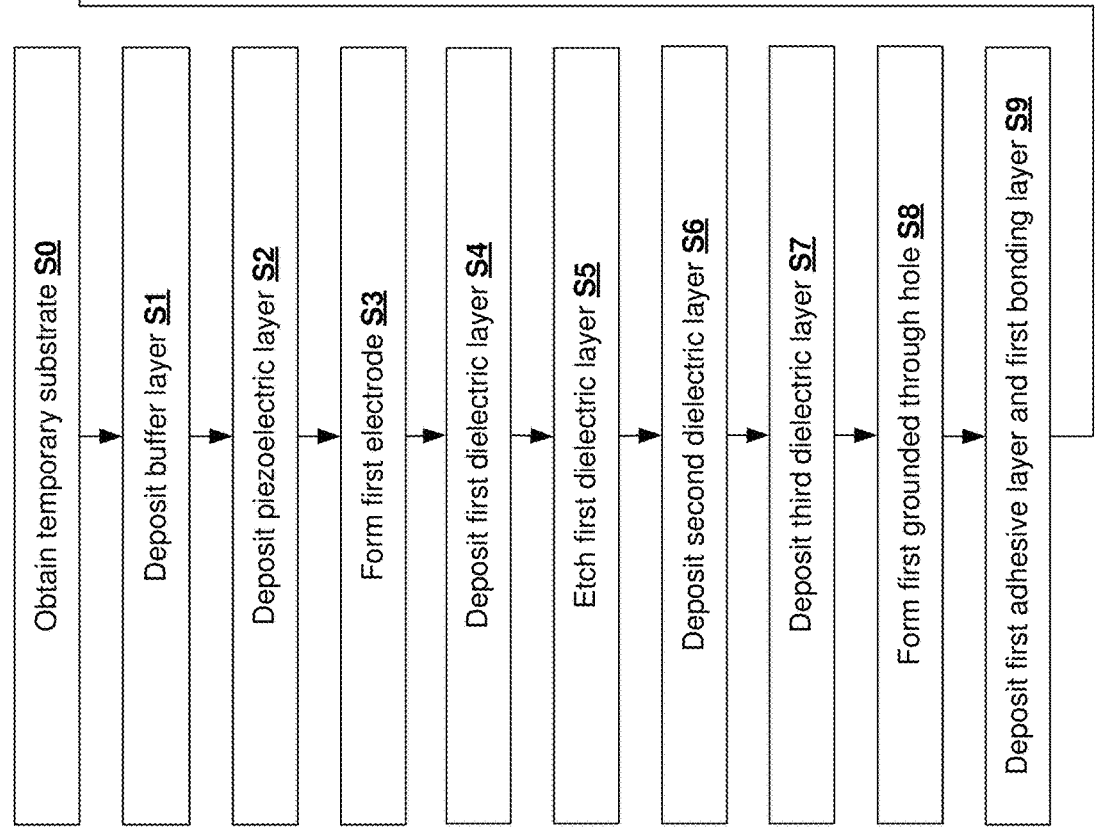
FIG. 2 is a flow chart of a process of fabricating the BAW resonator of FIGS. 1A and 1B, according to an embodiment of the present disclosure.
Figure 3A:
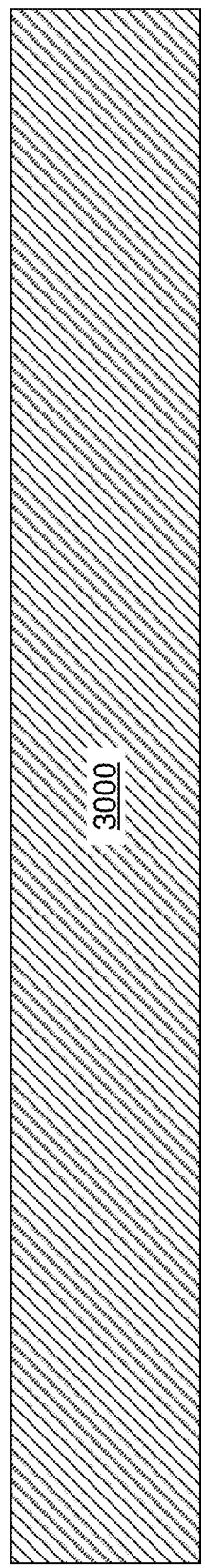
FIGS. 3A-3S are cross-sectional views of structures formed in the process of FIG. 2, according to an embodiment of the present disclosure.

FIG. 2 is a flow chart of a process 50 of fabricating BAW resonator 10, according to an embodiment of the present disclosure. FIGS. 3A-3S are cross-sectional views of structures formed in process 50, according to an embodiment of the present disclosure.

As illustrated in FIG. 3A, in step S0, a temporary substrate 3000 is obtained. Temporary substrate 3000 may be formed of silicon.

Figure 3B:
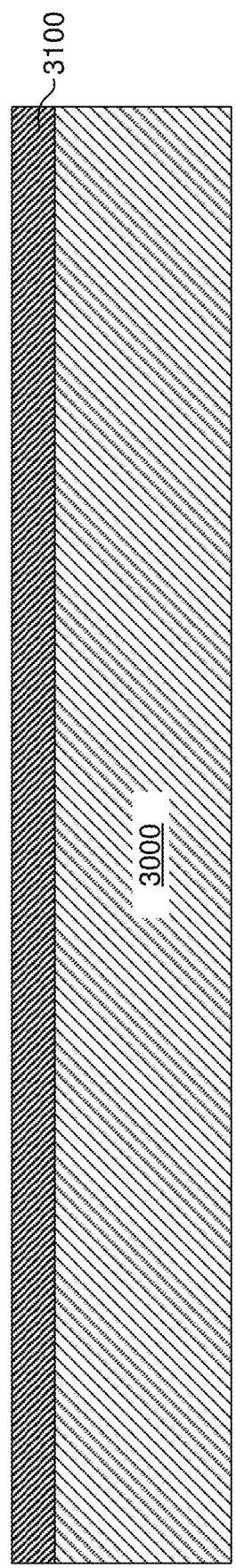

As illustrated in FIG. 3B, in step S1, a buffer layer 3100 is deposited on temporary substrate 3000. Buffer layer 3100 serves as an etch stop layer for removing temporary substrate 3000 in a subsequent process. Buffer layer 3100 also serves as a transition layer, which is beneficial to the quality of piezoelectric layer 140 which is subsequently grown on buffer layer 3100. Buffer layer 3100 may be formed of silicon oxide (SiO$_2$), silicon nitride (SiN), aluminum oxide (Al$_2$O$_3$), gallium nitride (GaN), aluminum nitride (AlN), or silicon carbide (SiC), or a stacked combination of two or more of those materials.

In one embodiment, an AlN layer is deposited on temporary substrate 3000 which is formed of silicon, and a GaN layer is deposited on the AlN layer. The stack of AlN layer and GaN layer is used as buffer layer 3100. In a subsequent process, an AlN or ScAlN piezoelectric layer is deposited on the surface of the GaN layer. Due to the good lattice matching between GaN and AlN/ScAlN, the crystal quality of the AlN or ScAlN piezoelectric layer is good.

In another embodiment, a silicon oxide layer is formed on the silicon temporary substrate 3000. The silicon oxide layer severs as buffer layer 3100, which also serves as an etch stop layer for subsequent removal of temporary substrate 3000. Then, a thin AlN seed layer ("first AlN layer") is deposited on the silicon oxide buffer layer 3100. The thin AlN seed layer is used to bond resonator substrate 100 in a subsequent process, and may be removed after removal of temporary substrate 3000. Therefore, the AlN seed layer may be formed thicker, which is beneficial to the quality of the piezoelectric crystal deposited thereon. Afterwards, an AlN layer ("second AlN layer") or a ScAlN piezoelectric layer is deposited on the AlN seed layer. The AlN seed layer may be removed after resonator substrate 100 is bonded and temporary substrate 3000 is removed.

In another embodiment, an AlN thin layer ("first AlN layer") is directly deposited on the silicon temporary substrate 3000 to serve as buffer layer 3100. The lattice quality of the AlN thin layer directly deposited on silicon temporary substrate 3000 is better than that of an AlN thin layer deposited on a silicon oxide layer. In addition, because the AlN thin layer may be removed in a subsequent process, the AlN thin layer may be formed thicker. After depositing the AlN thin layer, an AlN layer ("second AlN layer") or a ScAlN piezoelectric layer is deposited on the AlN thin layer. The AlN thin layer may be removed after resonator substrate 100 is bonded and temporary substrate 3000 is removed.

In another embodiment, when the piezoelectric layer is formed of pure AlN that is not doped with Sc, a silicon oxide layer may be deposited on temporary substrate 3000 to serve as buffer layer 3100. An AlN piezoelectric layer may be directly and continuously deposited on the silicon oxide layer at one time. After resonator substrate 100 is bonded and temporary substrate 3000 are removed, a lower portion of the AlN piezoelectric layer (the initially deposited part) may be removed to leave the remaining portion (an upper portion) of the AlN piezoelectric layer with good crystal quality as piezoelectric layer 140.

In still another embodiment, when the piezoelectric layer is formed of pure AlN that is not doped with Sc, an AlN piezoelectric layer can be directly and continuously deposited on temporary substrate 3000. The initially deposited part of the AlN piezoelectric layer serves as buffer layer 3100, which may be removed after resonator substrate 100 is bonded and temporary substrate 3000 is removed. The later deposited part of the AlN piezoelectric layer with good crystal quality serves as piezoelectric layer 140.

Figure 3C:
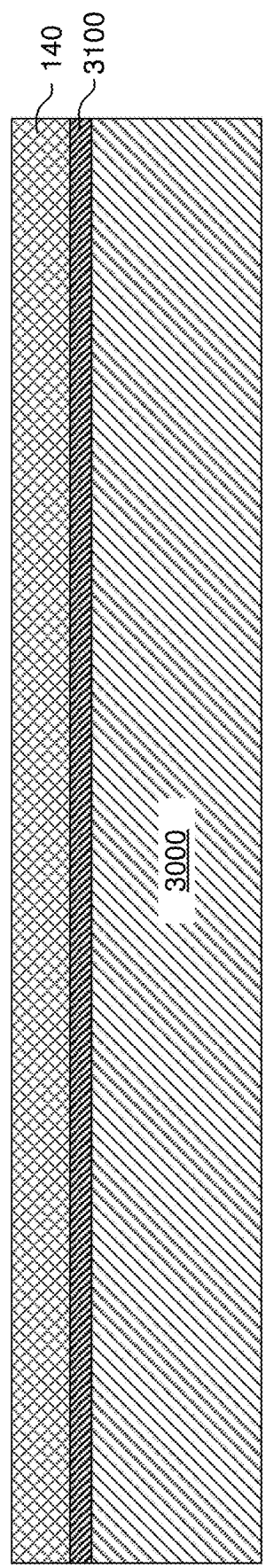

As illustrated in FIG. 3C, in step S2, piezoelectric layer 140 is deposited on buffer layer 3100. Piezoelectric layer 140 may be formed of AlN or scandium-doped aluminum nitride (ScAlN). The deposition thickness of piezoelectric layer 140 is greater than a target thickness of piezoelectric layer 140 in BAW resonator 10.

Figure 3D:
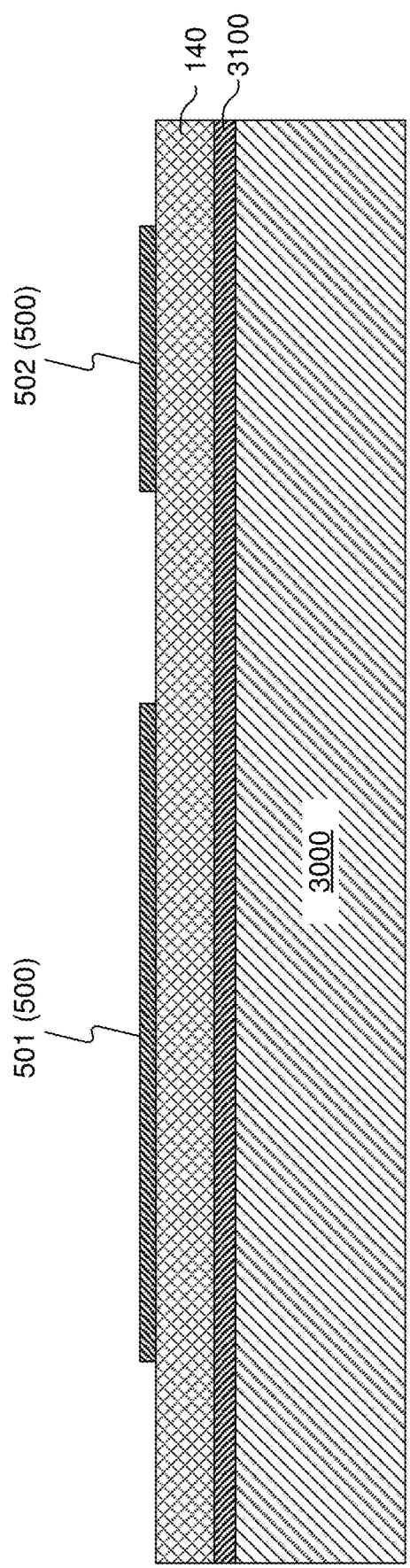

As illustrated in FIG. 3D, in step S3, first electrode 500 is formed on piezoelectric layer 140. First electrode 500 may be formed of a metal material. First electrode 500 includes at least two separate portions. In the embodiment illustrated in FIG. 3D, first electrode 500 includes first portion 501 and second portion 502 separated and spaced apart from each other. First portion 501 of first electrode 500 is used as an electrode of BAW resonator 10, and second portion 502 of first electrode 500 is used as an electrical connection part of metal bonding layer 200 to the external ground.

Figure 3E:
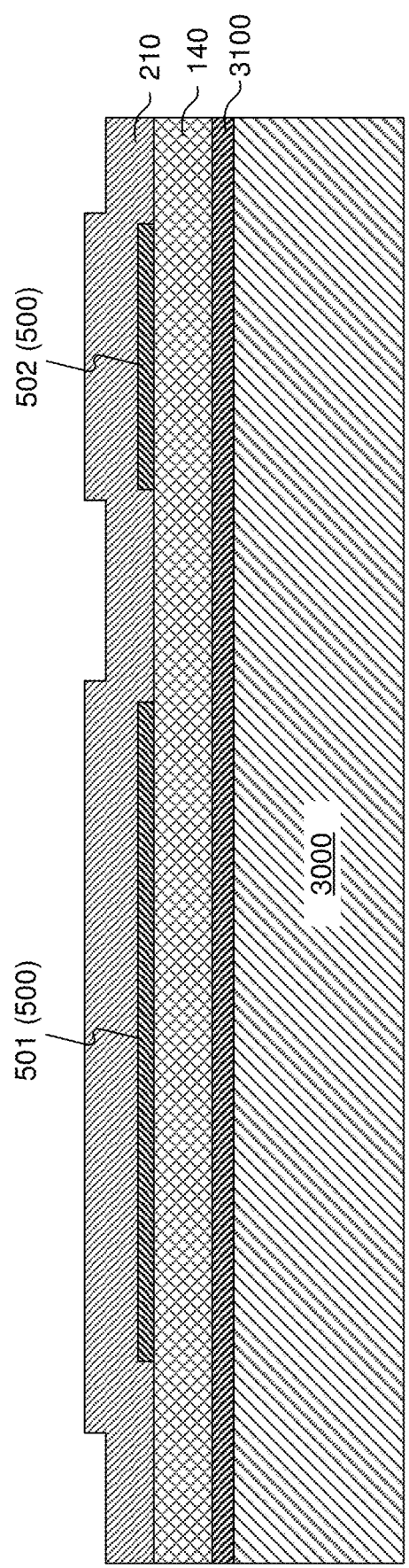

As illustrated in FIG. 3E, in step S4, first dielectric layer 210 is deposited on the structure of FIG. 3D. First dielectric layer 210 may be formed of silicon oxide. First dielectric layer 210 covers first electrode 500 (including first portion 501 and second portion 502) and piezoelectric layer 140.

Figure 3F:
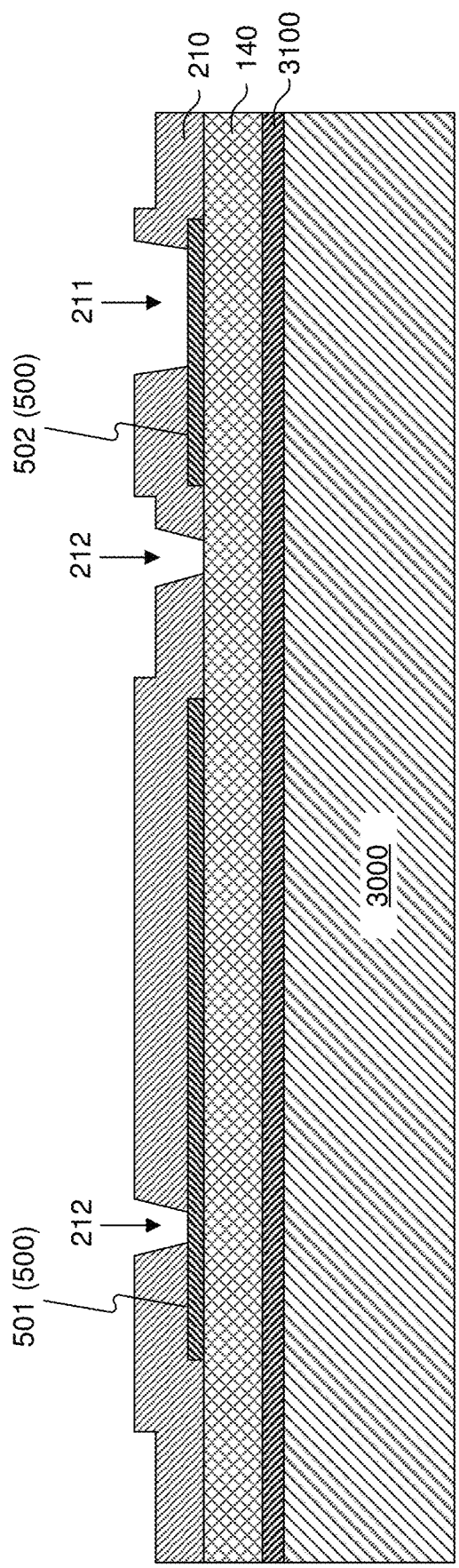

As illustrated in FIG. 3F, in step S5, first dielectric layer 210 is etched to form a first trench 211, and a second trench 212 surrounding the working area of BAW resonator 10. The portion of first dielectric layer 210 surrounded by second trench 212 serves as a sacrificial layer that will be removed in a subsequent process to form cavity 1000. A portion of second portion 502 of first electrode 500 is exposed at the bottom of first trench 211. A portion of piezoelectric layer 140 and a portion of first portion 501 of first electrode 500 are exposed at the bottom of second trench 212.

Figure 3G:
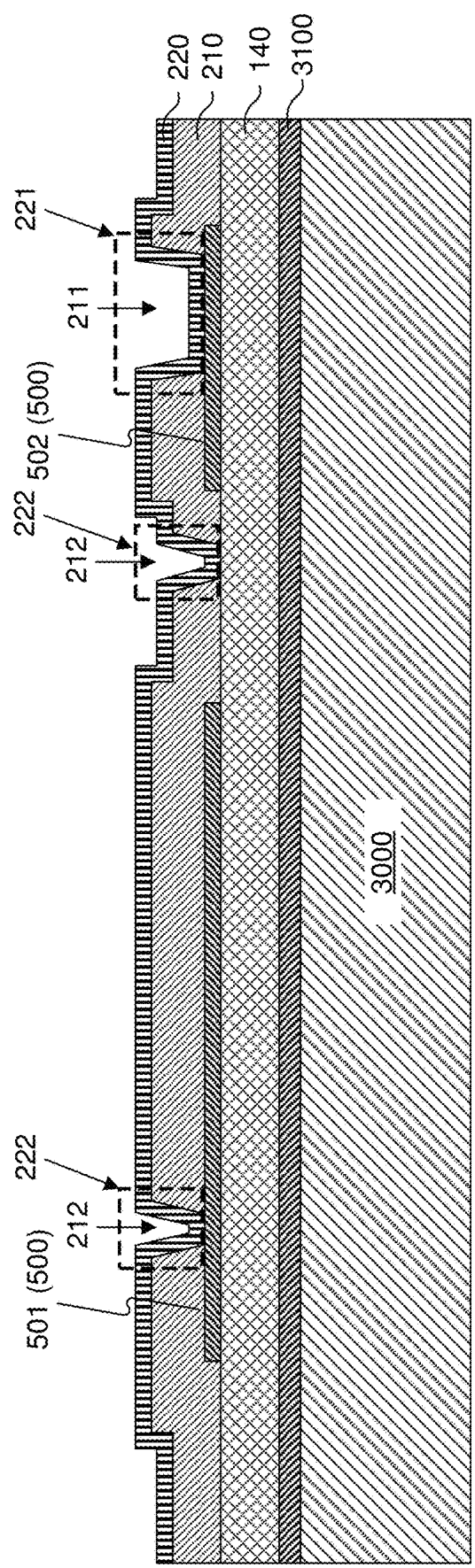

As illustrated in FIG. 3G, in step S6, second dielectric layer 220 is deposited on the surface of the structure of FIG. 3F. Second dielectric layer 220 may be formed of polysilicon, amorphous silicon, silicon nitride, aluminum nitride, gallium nitride, tantalum nitride, or a stacked combination of two or more of those materials. Second dielectric layer 220 completely covers the top surface of first dielectric layer 210, as well as the side surfaces and bottoms of first trench 211 and second trench 212 formed in first dielectric layer 210. Second dielectric layer 220 also covers the portion of second portion 502 of first electrode 500 exposed at the bottom of first trench 211, and the portions of piezoelectric layer 140 and first portion 501 of first electrode 500 exposed at the bottom of second trench 212. The portion of second dielectric layer 220 deposited on the side surfaces and the bottom of first trench 211 constitutes first double-wall protruding structure 221 protruding toward and contacting second portion 502 of first electrode 500. The portion of second dielectric layer 220 deposited on the side surfaces and the bottom of second trench 212 constitutes second double-wall protruding structure 222 that surrounds a portion of first dielectric layer 210 (referred to as "sacrificial island") which will be removed to form cavity 1000.

Figure 3H:
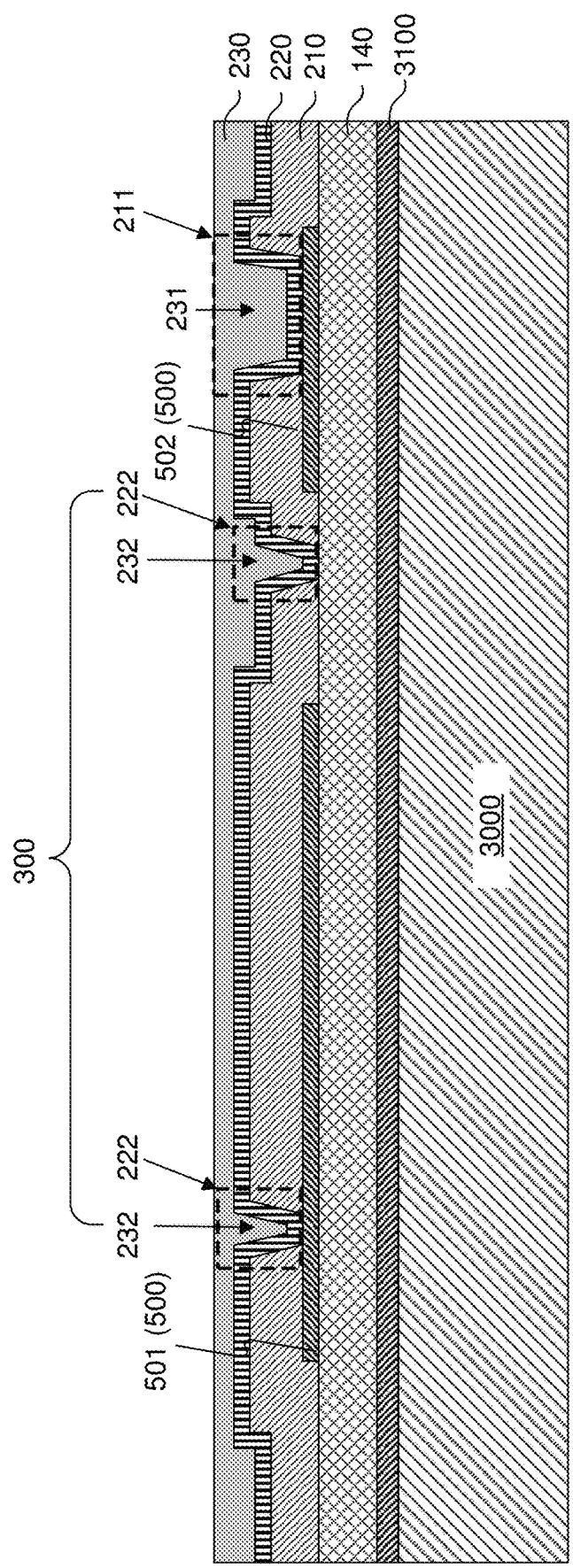

As illustrated in FIG. 3H, in step S7, third dielectric layer 230 is deposited on the surface of the structure of FIG. 3G. Then, the top surface of third dielectric layer 230 is planarized by using, for example, a chemical mechanical polishing (CMP) process. Third dielectric layer 230 may be formed of silicon oxide, silicon nitride, aluminum nitride, or other materials, or a stacked combination of two or more of those materials. Third dielectric layer 230 fills in first trench 211 in first double-wall protruding structure 221 and second trench 212 in second double-wall protruding structure 222, forming first protruding structure 231 and second protruding structure 232, respectively, which protrude toward piezoelectric layer 140. Second protruding structure 232 and second double-wall protruding structure 222 together constitute double-wall boundary structure 300 that surrounds the working area of BAW resonator 10 and defines cavity 1000.

Figure 3I:
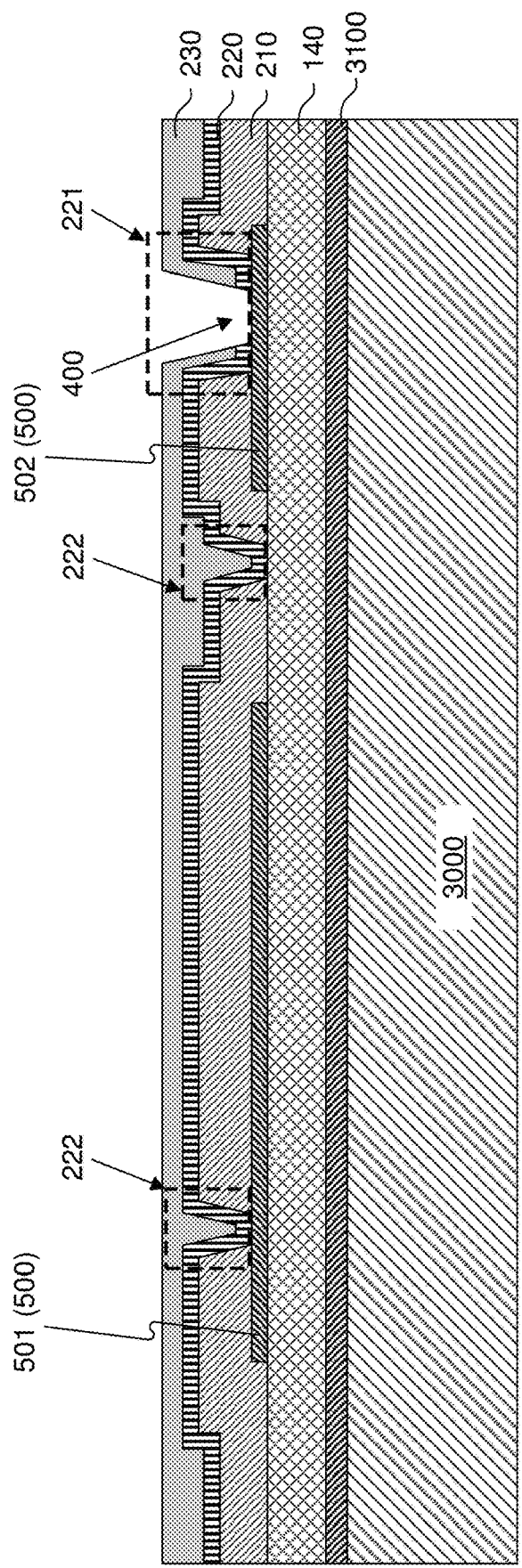

As illustrated in FIG. 3I, in step S8, in the part corresponding to first trench 211 (i.e., first double-wall protruding structure 221), third and second dielectric layers 230 and 220 are etched to expose a part of second portion 502 of first electrode 500, thereby forming first grounded through hole 400 for grounding metal bonding layer 200 (FIG. 1B). The opening size of first grounded through hole 400 is smaller than that of first trench 211.

Figure 3J:
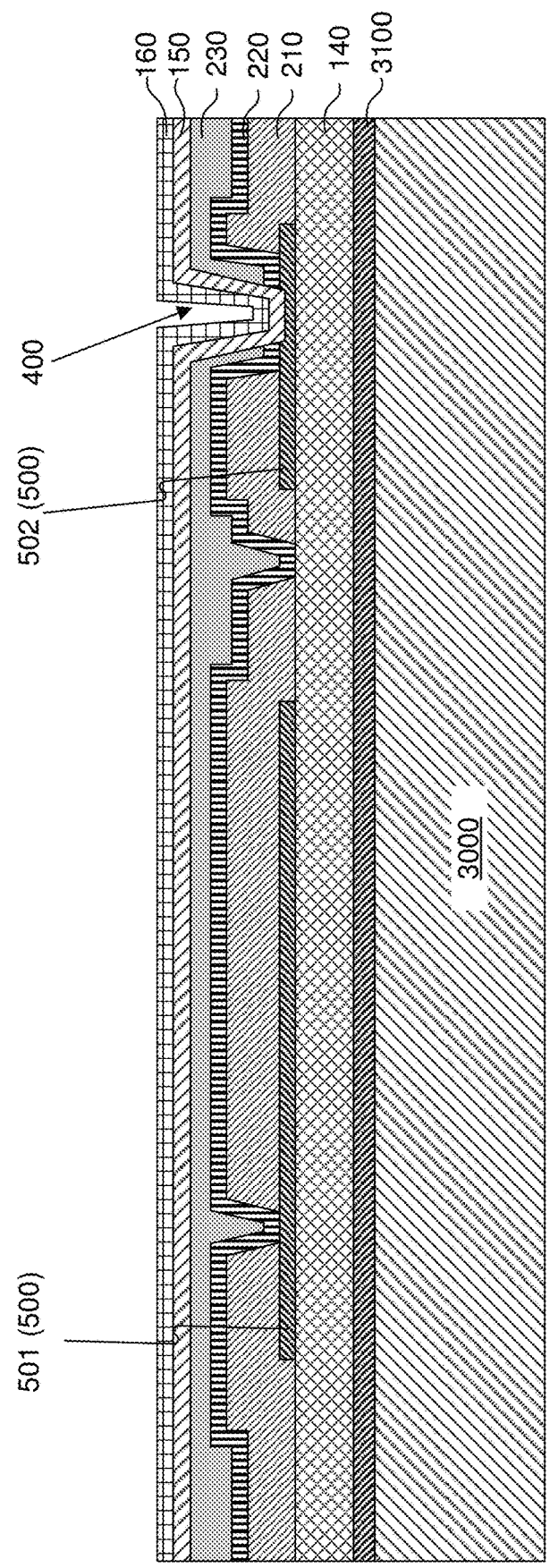

As illustrated in FIG. 3J, in step S9, first adhesive layer 150 and first bonding layer 160 are sequentially deposited on the surface of the structure of FIG. 3I. First adhesive layer 150 and first bonding layer 160 are both formed of metal materials. First adhesive layer 150 and first bonding layer 160 both cover the entire surface of third dielectric layer 230, and the sidewall surfaces of first grounded through hole 400 and second portion 502 of first electrode 500 exposed at the bottom thereof. First adhesive layer 150 adheres first bonding layer 160 to the surface of third dielectric layer 230 and second portion 502 of first electrode layer 500 exposed at the bottom of first grounded through hole 400. First adhesive layer 150 may be formed of chromium (Cr), titanium (Ti), titanium nitride (TiN), titanium tungsten (TiW), tantalum (Ta), tantalum nitride (TaN), or other materials, or a stacked combination of two or more of those materials. First bonding layer 160 and second bonding layer 180 (deposited on second adhesive layer 170 on the surface of resonator substrate 100) will be bonded together via eutectic bonding or metal diffusion bonding.

Figure 3K:
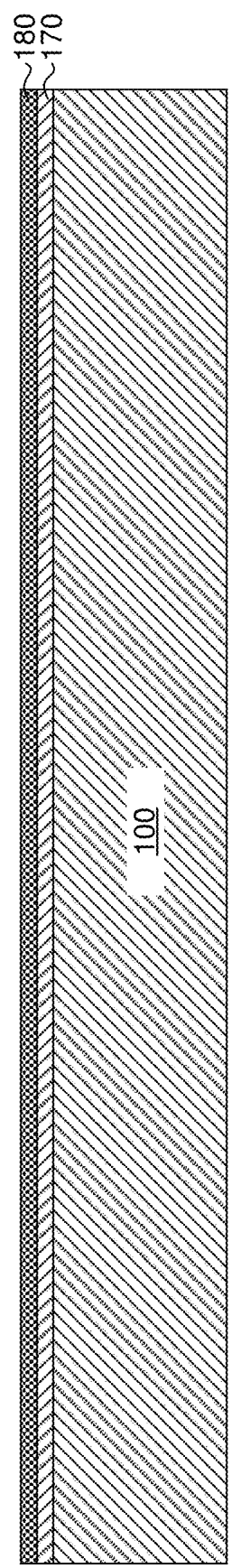

As illustrated in FIG. 3K, in step S10, resonator substrate 100 is obtained, and second adhesive layer 170 and second bonding layer 180 are sequentially deposited on resonator substrate 100. Both of second adhesive layer 170 and second bonding layer 180 are metal materials. Resonator substrate 100 may be formed of silicon, glass (silicon oxide), sapphire ($Al_2O_3$), gallium nitride (GaN), silicon carbide (SiC), aluminum nitride (AlN). Second adhesive layer 170 adheres second bonding layer 180 to the surface of resonator substrate 100. Second adhesive layer 170 may be formed of chromium (Cr), titanium (Ti), titanium nitride (TiN), titanium tungsten (TiW), tantalum (Ta), tantalum nitride (TaN), or other materials, or a stacked combination of two or more of those materials. Second bonding layer 180 and first bonding layer 160 are bonded together via eutectic bonding or metal diffusion bonding. First bonding layer 160 and second bonding layer 180 may be formed of a single metal or a stack of multiple metal materials suitable for the bonding process.

In one embodiment, both of first bonding layer 160 and second bonding layer 180 are formed of gold (Au), copper (Cu), or aluminum (Al), and first bonding layer 160 and second bonding layer 180 are bonded together by metal diffusion bonding. In another embodiment, one of first bonding layer 160 and second bonding layer 180 is formed of a stack of gold (Au) and indium (In) (an indium layer covering a gold layer), and the other one of first bonding layer 160 and second bonding layer 180 is formed of gold (Au), and first bonding layer 160 and second bonding layer 180 are bonded together by Au—In eutectic alloy bonding. In another embodiment, one of first bonding layer 160 and second bonding layer 180 is formed of a stack of nickel (Ni), indium (In), and gold (Au), and the other one of first bonding layer 160 and second bonding layer 180 is formed of a stack of nickel (Ni) and gold (Au), and first bonding layer 160 and second bonding layer 180 are bonded together by Au—In eutectic alloy bonding. In another embodiment, one of first bonding layer 160 and second bonding layer 180 is formed of a stack of copper (Cu) and tin (Sn) (a tin layer covering a copper layer), and the other one of first bonding layer 160 and second bonding layer 180 is formed of copper (Cu), and first bonding layer 160 and second bonding layer 180 are bonded together by Cu—Sn eutectic alloy bonding. In another embodiment, one of first bonding layer 160 and second bonding layer 180 is formed of a stack of gold (Au) and tin (Sn) (a tin layer covering a gold layer), and the other one of first bonding layer 160 and second bonding layer 180 is formed of gold (Au), and first bonding layer 160 and second bonding layer 180 are bonded together by Au—Sn eutectic alloy bonding. In another embodiment, one of first bonding layer 160 and second bonding layer 180 is formed of a stack of nickel (Ni) and tin (Sn) (a tin layer covering a nickel layer), and the other one of first bonding layer 160 and second bonding layer 180 is formed of gold (Au), and first bonding layer 160 and second bonding layer 180 are bonded together by Au—Sn eutectic alloy bonding.

Figure 3L:
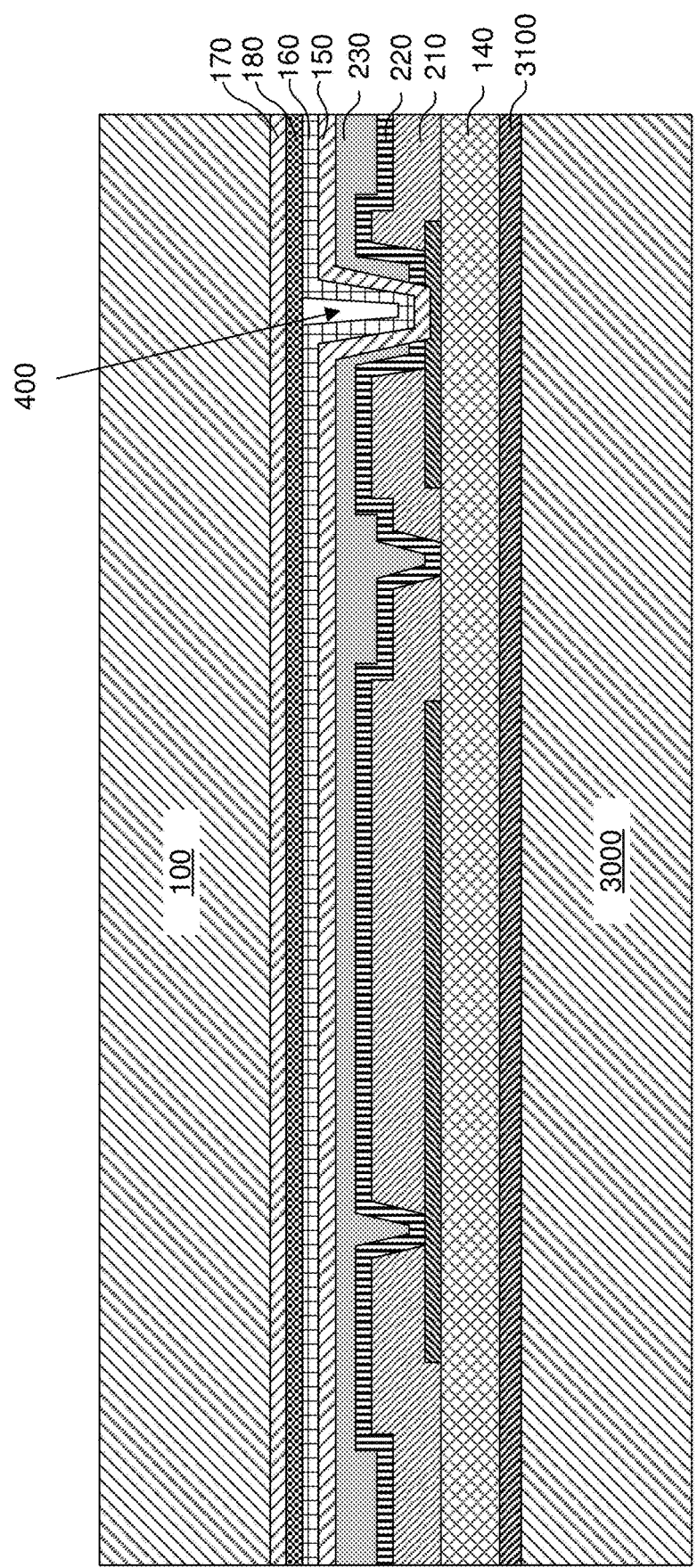

As illustrated in FIG. 3L, in step S11, first bonding layer 160 and second bonding layer 180 are bonded together, such that the structure of FIG. 3K is bonded with the structure of FIG. 3J. As a result, first grounded through hole 400 is covered by second bonding layer 180 formed on resonator substrate 100.

Figure 3M:
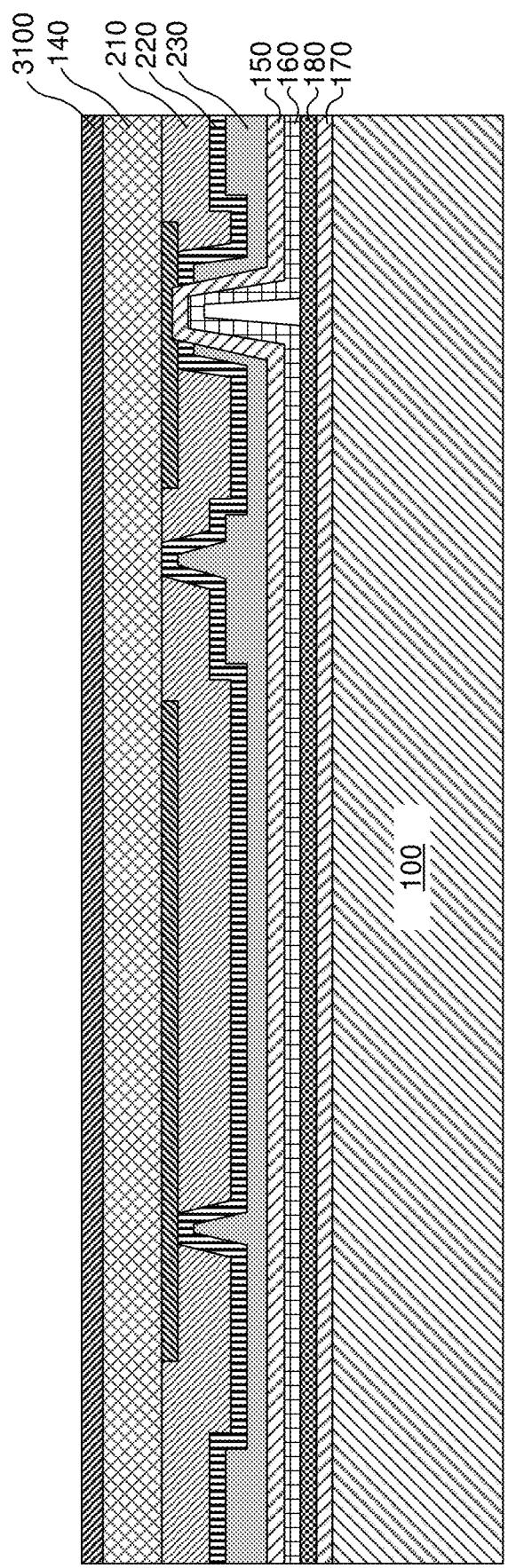

As illustrated in FIG. 3M, in step S12, the structure of FIG. 3L is flipped over, and temporary substrate 3000 is removed to expose buffer layer 3100.

Figure 3N:
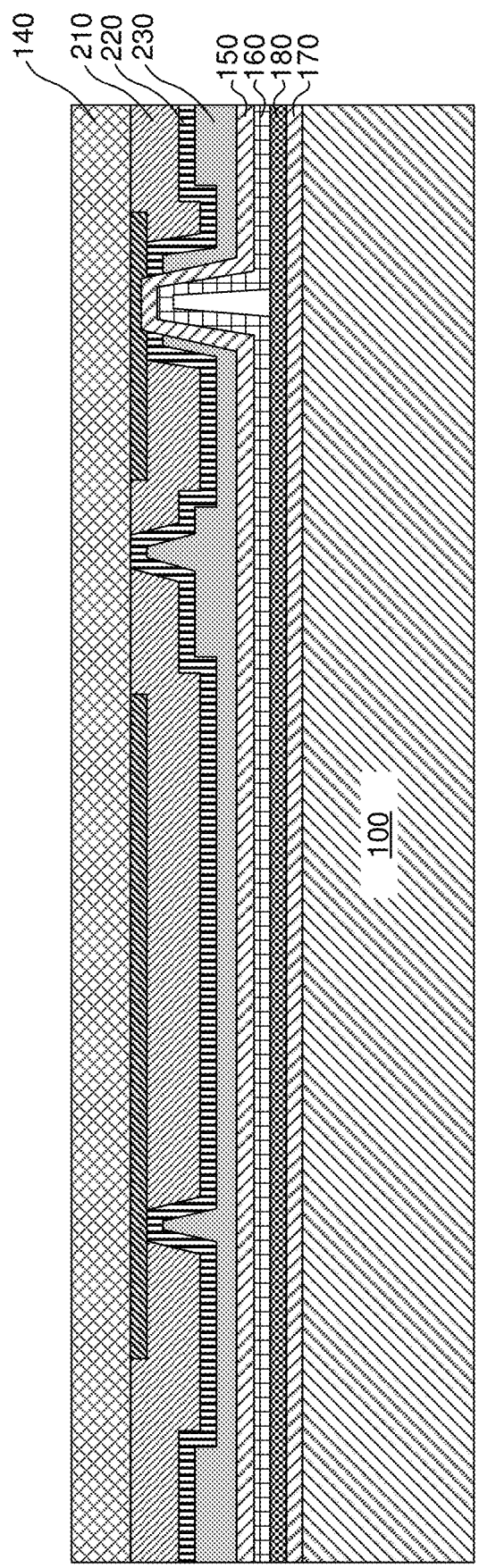

As illustrated in FIG. 3N, in step S13, buffer layer 3100 is removed to expose a surface layer of piezoelectric layer 140.

Figure 3O:
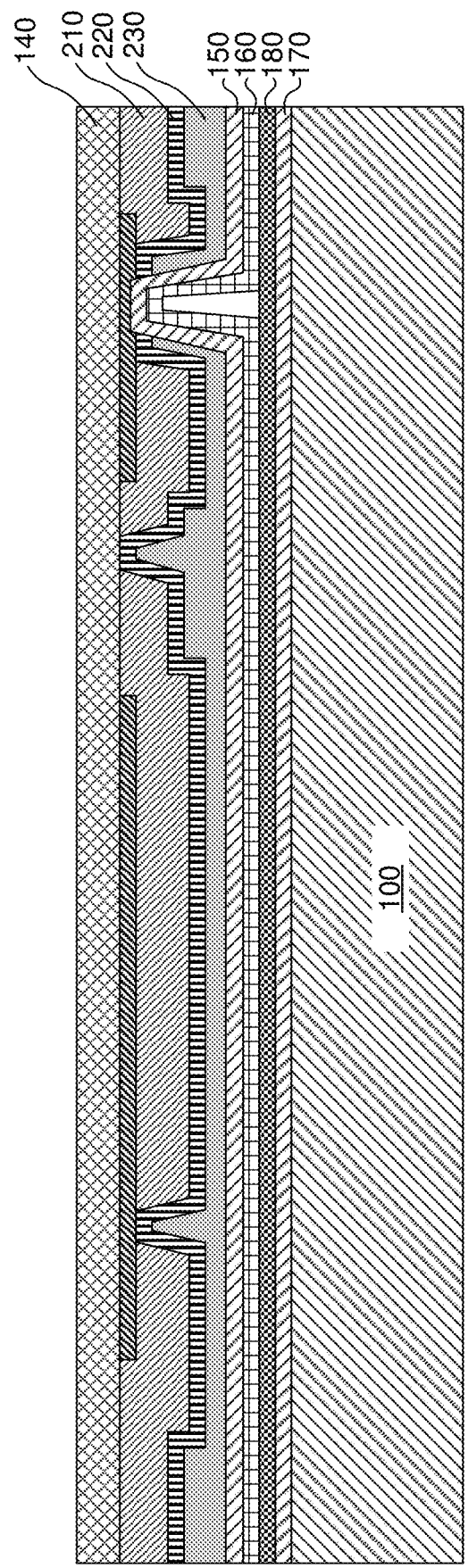

As illustrated in FIG. 3O, in step S14, a dry etching or an ion beam etching (IBE) process is performed to remove the exposed surface layer of piezoelectric layer 140. As a result, the thickness of piezoelectric layer 140 may be accurately controlled to be equal to the target thickness required for BAW resonator 10. The removed portion of piezoelectric layer 140 is the initially deposited portion of piezoelectric layer 140, the quality of which is relatively low and the piezoelectric performance of which is relatively poor. Thus, the removal of the initially deposited portion of piezoelectric layer 140 improves the performance of BAW resonator 10.

Figure 3P:
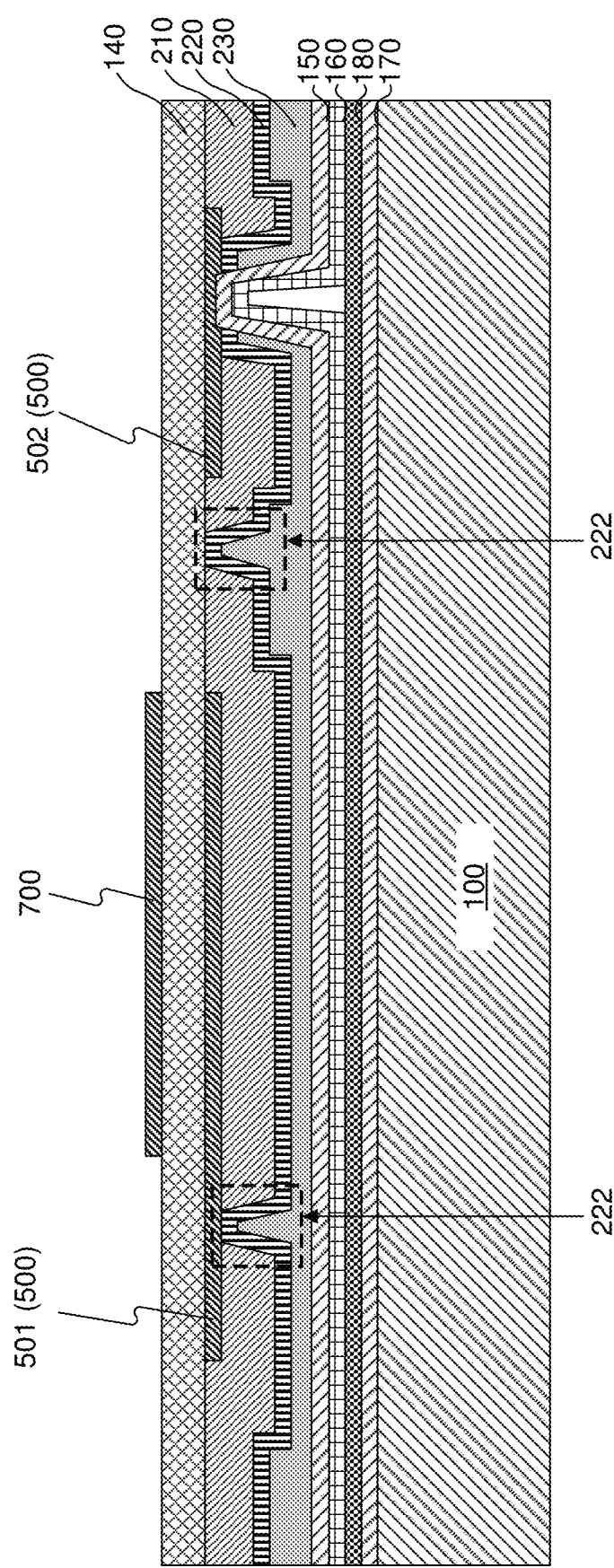

As illustrated in FIG. 3P, in step S15, second electrode 700 is formed on piezoelectric layer 140. Second electrode 700 partially overlaps first portion 501 of first electrode 500.

The overlapping portions of first portion 501 of first electrode 500 and second electrode 700 are surrounded by second double-wall protruding structure 222. That is, the overlapping portions of first electrode 500 and second electrode 700 are disposed with cavity 1000 to be formed in a subsequent process.

Figure 3Q:
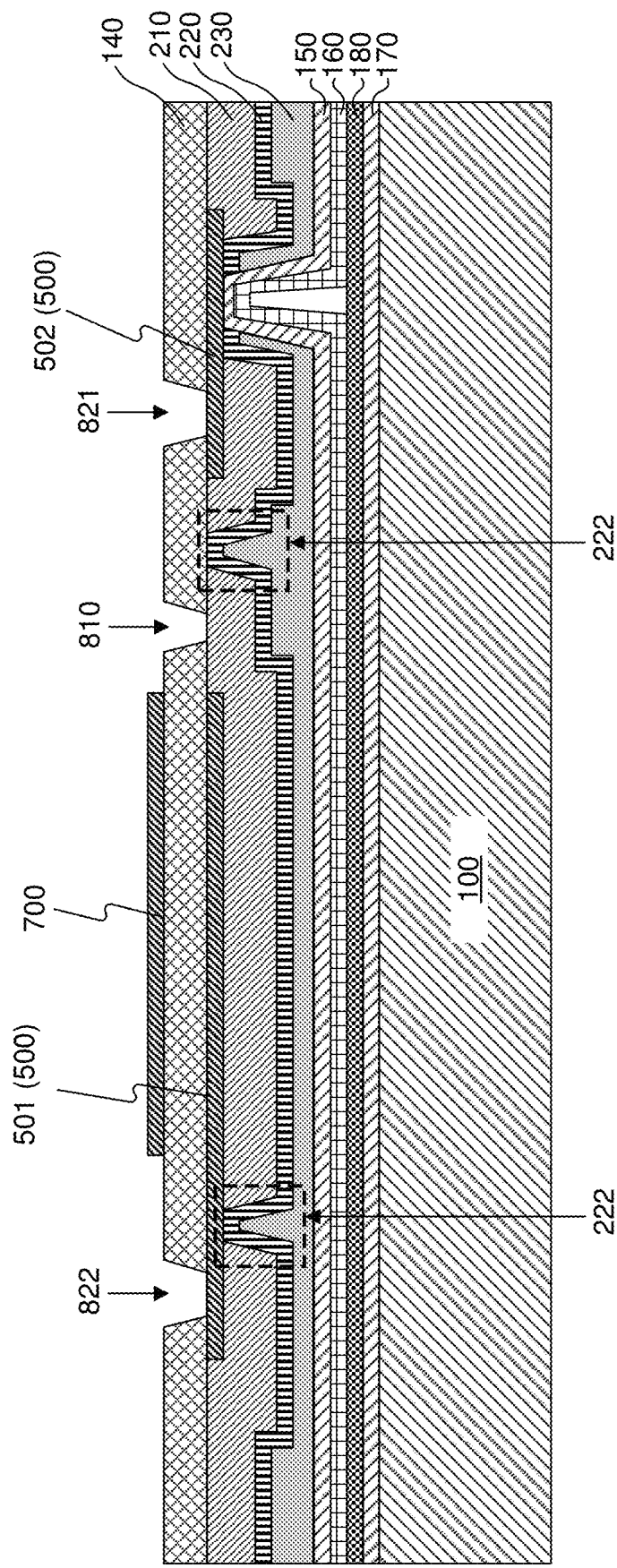

As illustrated in FIG. 3Q, in step S16, piezoelectric layer 140 is etched to form one or more release holes 810, second grounded through hole 821, and contact hole 822. Release holes 810 expose the portion of first dielectric layer 210 surrounded by second double-wall protruding structure 222 (i.e., the sacrificial island for forming cavity 1000). Second grounded through hole 821 exposes a portion of the second surface (the top surface) of second portion 502 of first electrode 500. Contact hole 822 exposes a portion of first portion 501 of first electrode 500.

Figure 3R:
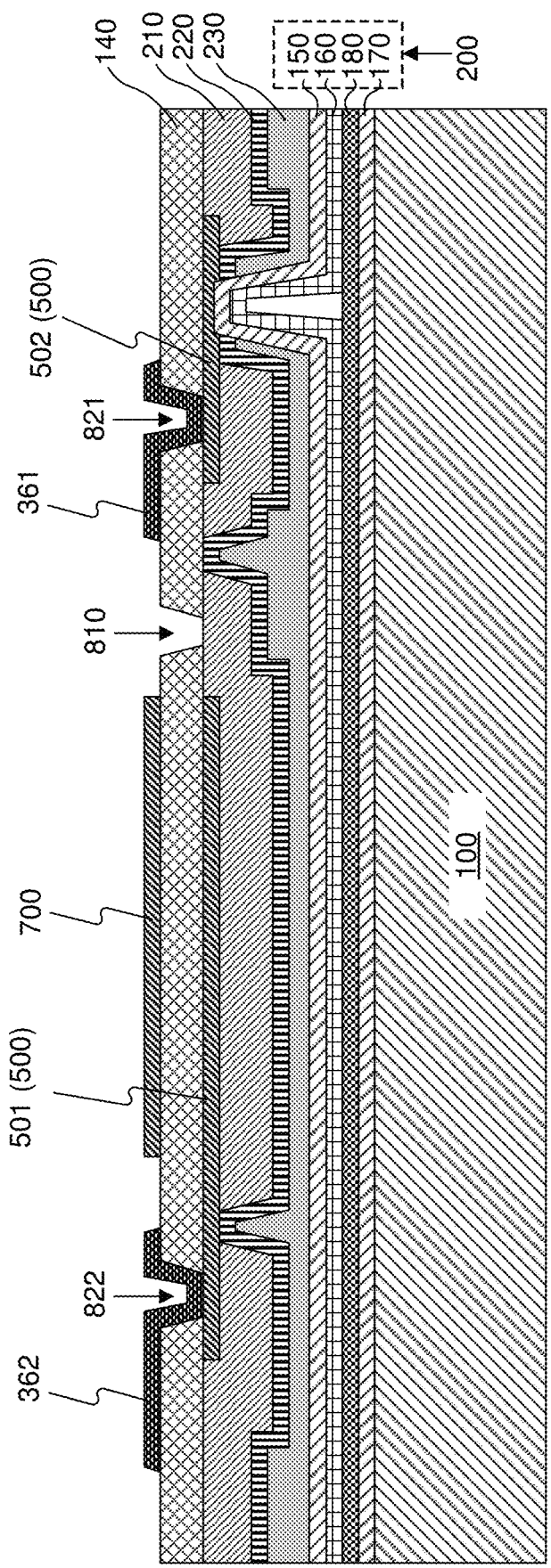
Figure 3S:
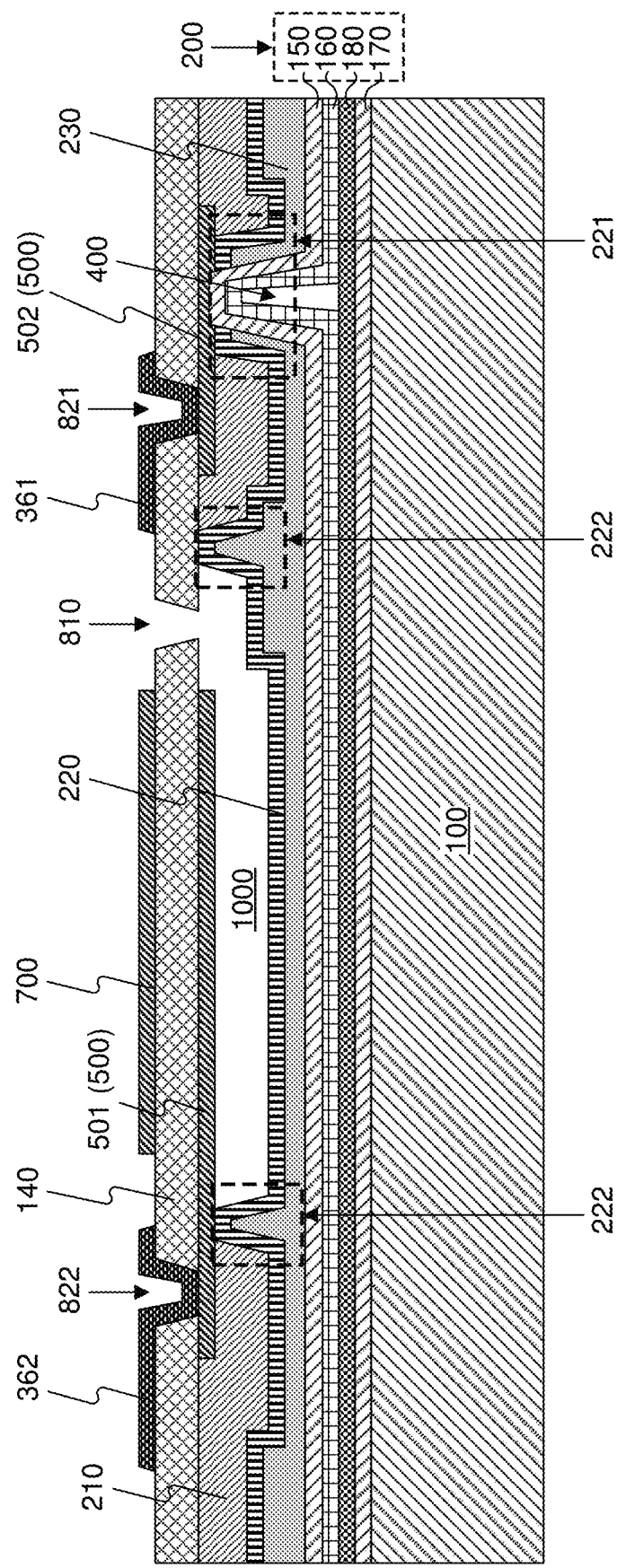

As illustrated in FIG. 3R, in step S17, a pad metal layer is formed on the structure of FIG. 3Q, and the pad metal layer is patterned to form ground pad metal layer 361 and first electrode pad metal layer 362. Ground pad metal layer 361 is disposed on piezoelectric layer 140 and in second grounded through hole 821, and contacts the second surface of second portion 502 of first electrode 500 via second grounded through hole 821. Ground pad metal layer 361 is used to electrically connect metal bonding layer 200 to ground. First electrode pad metal layer 362 is disposed on piezoelectric layer 140 and in contact hole 822, and contacts first portion 501 of first electrode 500 via contact hole 822. First electrode pad metal layer 362 is used for external electrical connection of BAW resonator 10.

As illustrated in FIG. 3S, in step S18, the portion of first dielectric layer 210 surrounded by second double-wall protruding structure 222 is etched and removed to form cavity 1000. The etchant and etching product formed during the etching process is released via the one or more release holes 810. Thus, BAW resonator 10 illustrated in FIGS. 1A and 1B is fabricated.

Figure 4A:
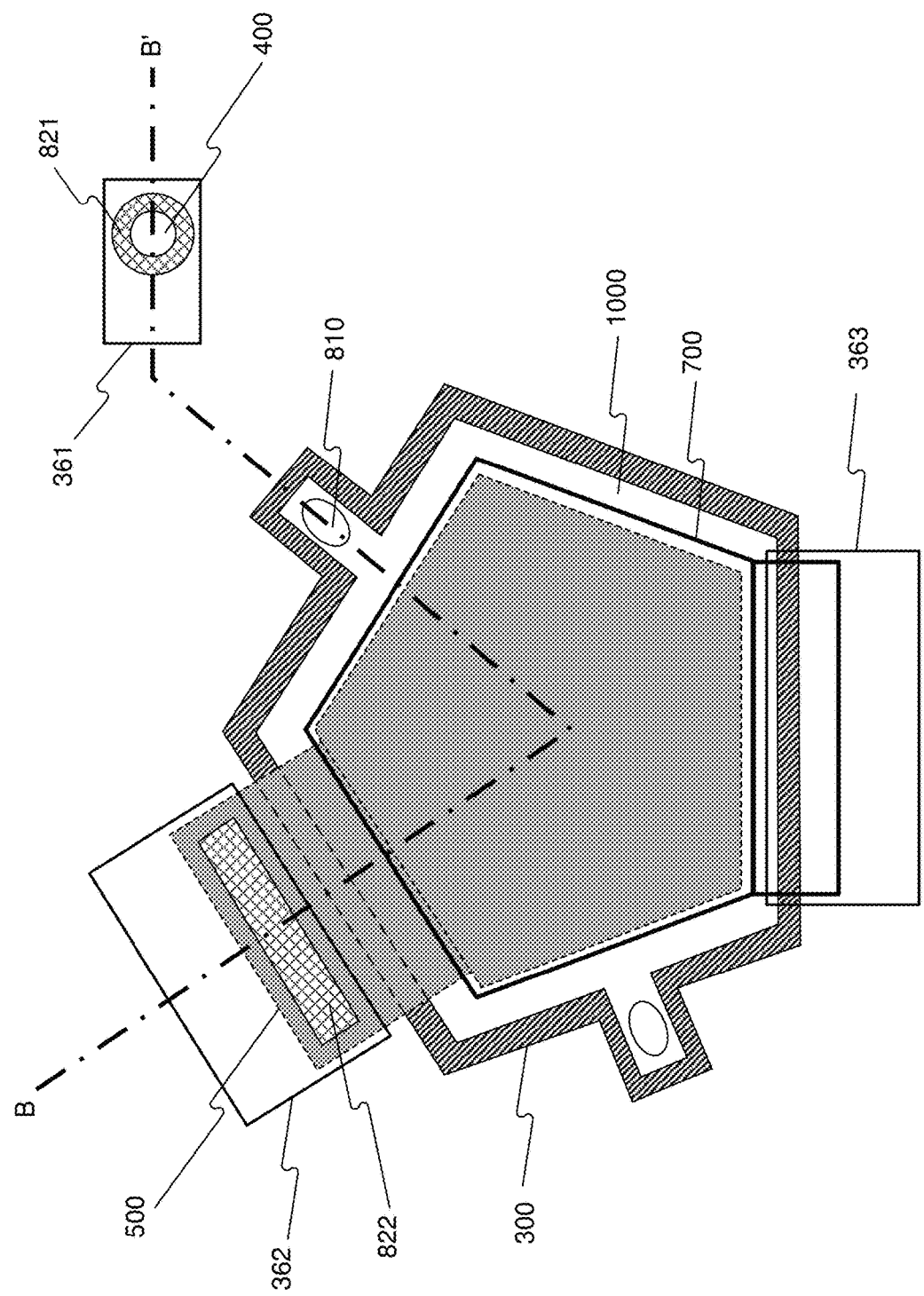
FIG. 4A is a top view showing selected portions of a BAW resonator to be used in a BAW filter, according to an embodiment of the present disclosure.
Figure 4B:
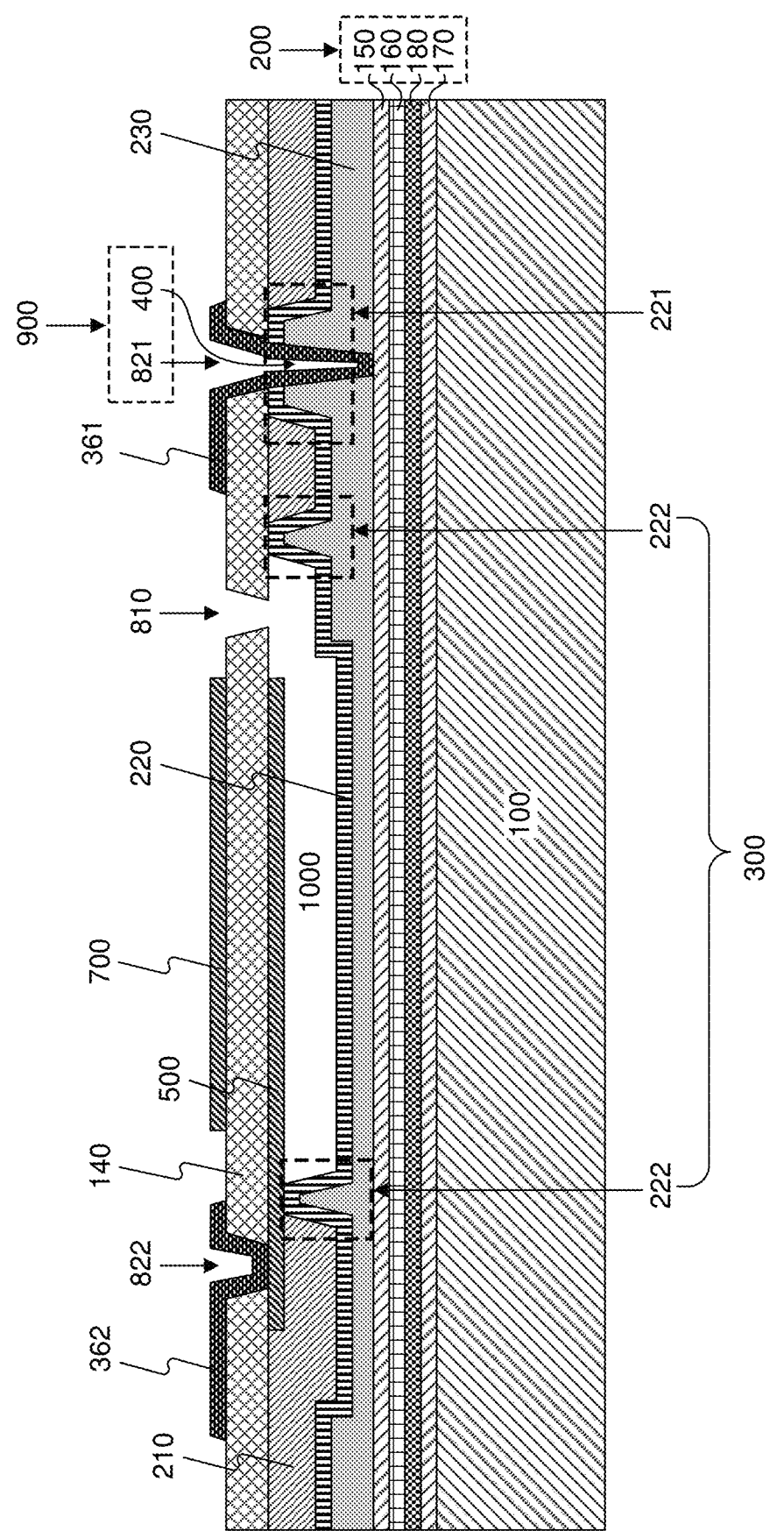
FIG. 4B is a cross-sectional view of the BAW resonator of FIG. 4A, along cross-sectional line B-B' shown in FIG. 4A.

FIG. 4A is a top view showing selected portions of a BAW resonator 20 to be used in a BAW filter, according to an embodiment of the present disclosure. FIG. 4B is a cross-sectional view of the BAW resonator 20 of FIG. 4A, along cross-sectional line B-B' shown in FIG. 4A.

As illustrated in FIGS. 4A and 4B, BAW resonator 20 includes a resonator substrate 100, a piezoelectric layer 140 disposed above resonator substrate 100, a first electrode 500 disposed below piezoelectric layer 140, a second electrode 700 disposed above piezoelectric layer 140, a first dielectric layer 210, a second dielectric layer 220, and a third dielectric layer 230 sequentially disposed between resonator substrate 100 and piezoelectric layer 140 in an order from piezoelectric layer 140 to resonator substrate 100, a cavity 1000 disposed below first electrode 500, and a metal bonding layer 200 disposed between third dielectric layer 230 and resonator substrate 100 and including a first adhesive layer 150, a first bonding layer 160, a second adhesive layer 170, and a second bonding layer 180.

Second dielectric layer 220 includes a first double-wall protruding structure 221 and a second double-wall protruding structure 222 protruding through first dielectric layer 210 toward piezoelectric layer 140. First double-wall protruding structure 221 is spaced apart from cavity 1000, and contacts a first surface (i.e., a bottom surface) of piezoelectric layer 140. Second double-wall protruding structure 222 surrounds cavity 1000, and contacts a portion of piezoelectric layer 140 and a portion of first electrode 500. Third dielectric layer 230 fills in first double-wall protruding structure 221 and second double-wall protruding structure 222. First adhesive layer 150 is disposed below and contacts third dielectric layer 230. First bonding layer 160 is disposed below first adhesive layer 150. Second adhesive layer 170 is disposed on a surface of resonator substrate 100 facing piezoelectric layer 140. Second bonding layer 180 is disposed on second adhesive layer 170 and bonds to first bonding layer 160 by eutectic bonding or metal diffusion bonding.

A grounded through hole 900 is disposed through piezoelectric layer 140, second dielectric layer 220, and third dielectric layer 230, to expose first adhesive layer 150. Grounded through hole 900 includes a first grounded through hole 400 disposed in first double-wall protruding structure 221 and exposes first adhesive layer 150, and a second grounded through hole 821 disposed in piezoelectric layer 140 and aligned with and connected to first grounded through hole 400. A ground pad metal layer 361 is disposed on piezoelectric layer 140 and in grounded through hole 900, and contacts first adhesive layer 150 via grounded through hole 900.

A contact hole 822 is disposed in piezoelectric layer 140, and exposes a portion of first electrode 500. A first electrode pad metal layer 362 is disposed on piezoelectric layer 140 and in contact hole 822, and contacts first electrode 500 via contact hole 822.

In BAW resonator 20 illustrated in FIGS. 4A and 4B, metal bonding layer 200 including first adhesive layer 150, first bonding layer 160, second adhesive layer 170, and second bonding layer 180, is electrically connected to ground pad metal layer 361. During operation of BAW resonator 10, ground pad metal layer 361 is grounded, and thus metal bonding layer 200 is grounded.

The other components of BAW resonator 20 are similar to the components of BAW resonator 10. Therefore, detailed descriptions of those components of BAW resonator 20 are not repeated.

Figure 5:
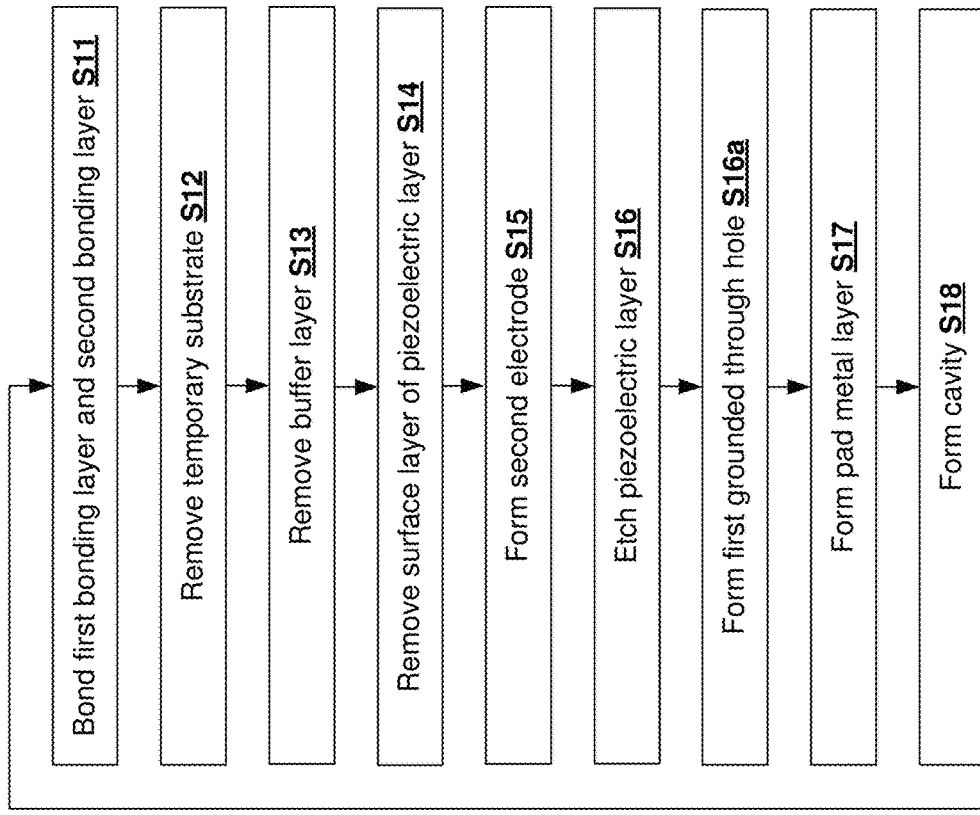
FIG. 5 is a flow chart of a process of fabricating the BAW resonator of FIGS. 4A and 4B, according to an embodiment of the present disclosure.

FIG. 5 is a flow chart of a process 60 of fabricating BAW resonator 20, according to an embodiment of the present disclosure. FIGS. 6A-6F are cross-sectional views of structures formed in process 60 of FIG. 5, according to an embodiment of the present disclosure.

Process 60 illustrated in FIG. 5 is similar to process 50 illustrated in FIG. 2, except that process 60 omits step S8 for forming first grounded through hole 400, and adds step S16*a* for forming first grounded through hole 400 after forming second grounded through hole 821 in step S16. The other steps are similar to those in process 50, and detailed descriptions thereof are not repeated.

Figure 6A:
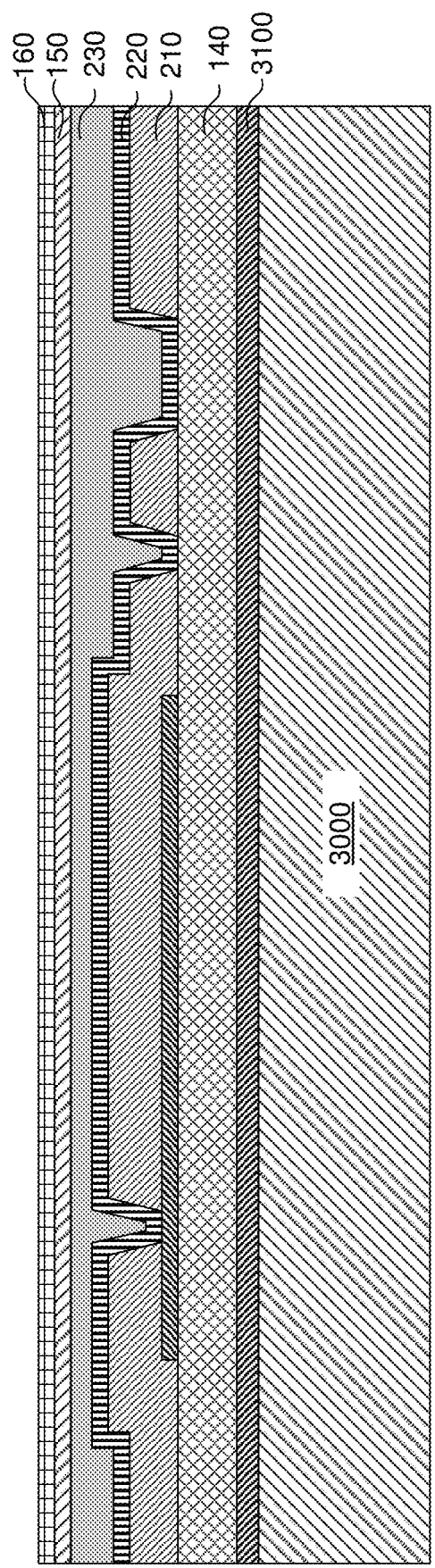

Specifically, as illustrated in FIG. 6A, in step S9, after step S7 in which third dielectric layer 230 is deposited and planarized, and without forming a through hole in third dielectric layer 230, first adhesive layer 150 and first bonding layer 160 are sequentially deposited on the planarized surface of third dielectric layer 230. First adhesive layer 150 covers the entire surface of third dielectric layer 230, and adheres first bonding layer 160 to the surface of third dielectric layer 230.

Figure 6B:
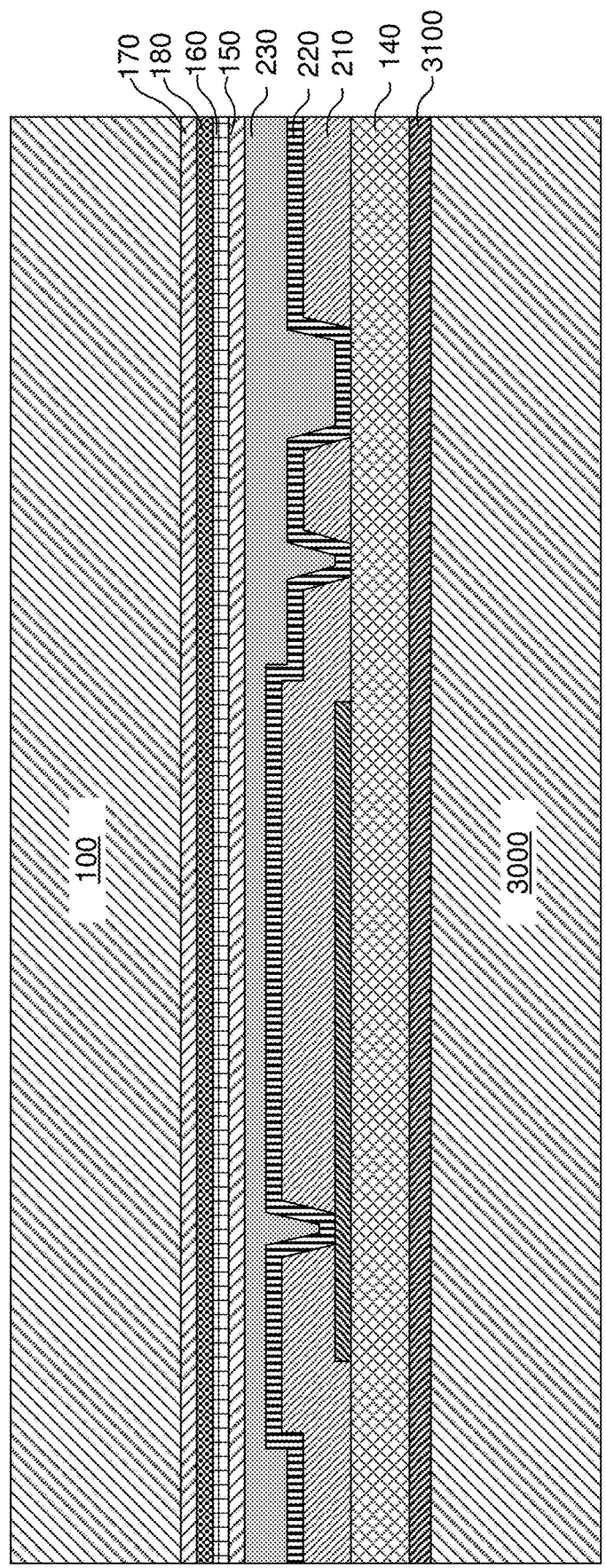

As illustrated in FIG. 6B, in step S11, after step S10 in which second adhesive layer 170 and second bonding layer 180 are sequentially deposited on resonator substrate 100, first bonding layer 160 and second bonding layer 180 are bonded together.

Figure 6C:
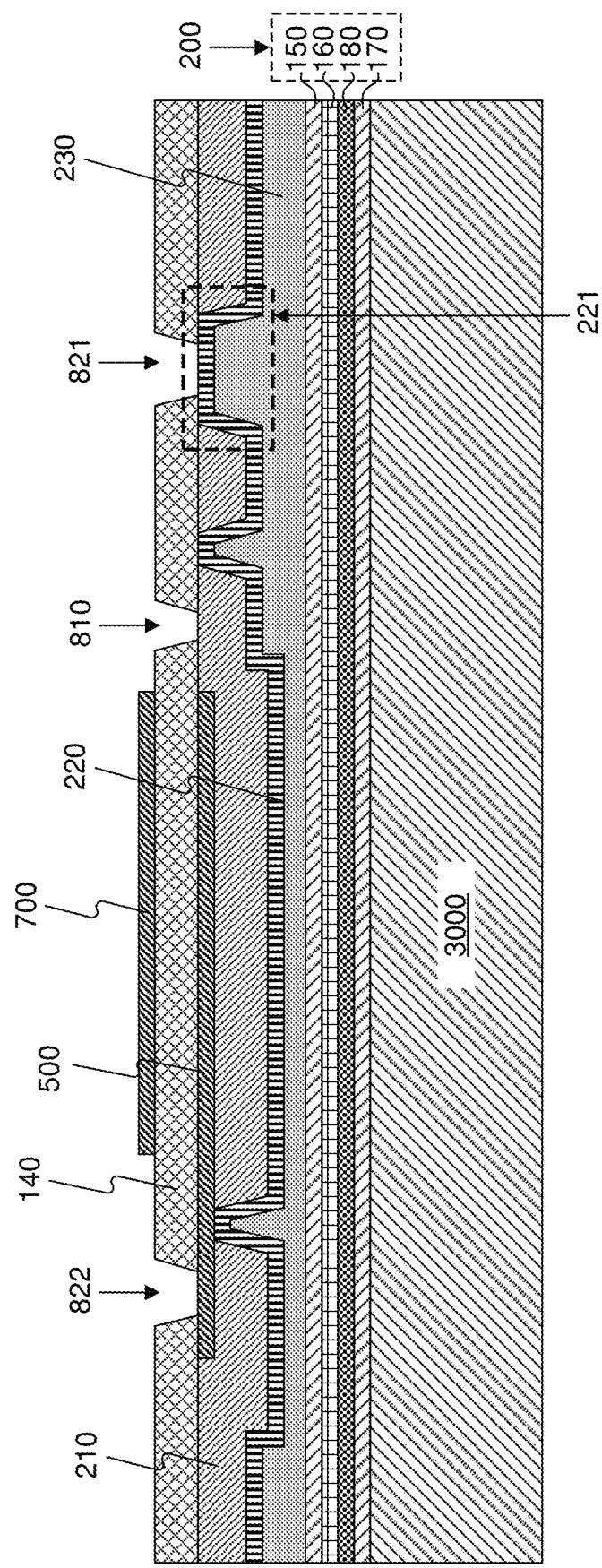

As illustrated in FIG. 6C, in step S16, after step S15 in which second electrode 700 is formed on piezoelectric layer 140, piezoelectric layer 140 is etched to form one or more release holes 810, second grounded through hole 821, and contact hole 822. Release holes 810 expose the portion of first dielectric layer 210 surrounded by second double-wall protruding structure 222 (i.e., the sacrificial island for forming cavity 1000). Second grounded through hole 821 exposes a portion of a top surface of first double-wall protruding structure 221. Contact hole 822 exposes a portion of first portion 501 of first electrode 500.

As illustrated in FIG. 6D, in step S16a, at the bottom of second grounded through hole 821, second dielectric layer 220 and third dielectric layer 230 are etched to expose first adhesive layer 150 of metal bonding layer 200, thus forming first grounded through hole 400. First grounded through hole 400 is vertically aligned with second grounded through hole 821. First grounded through hole 400 and second grounded through hole 821 together constitute grounded through hole 900.

Figure 6E:
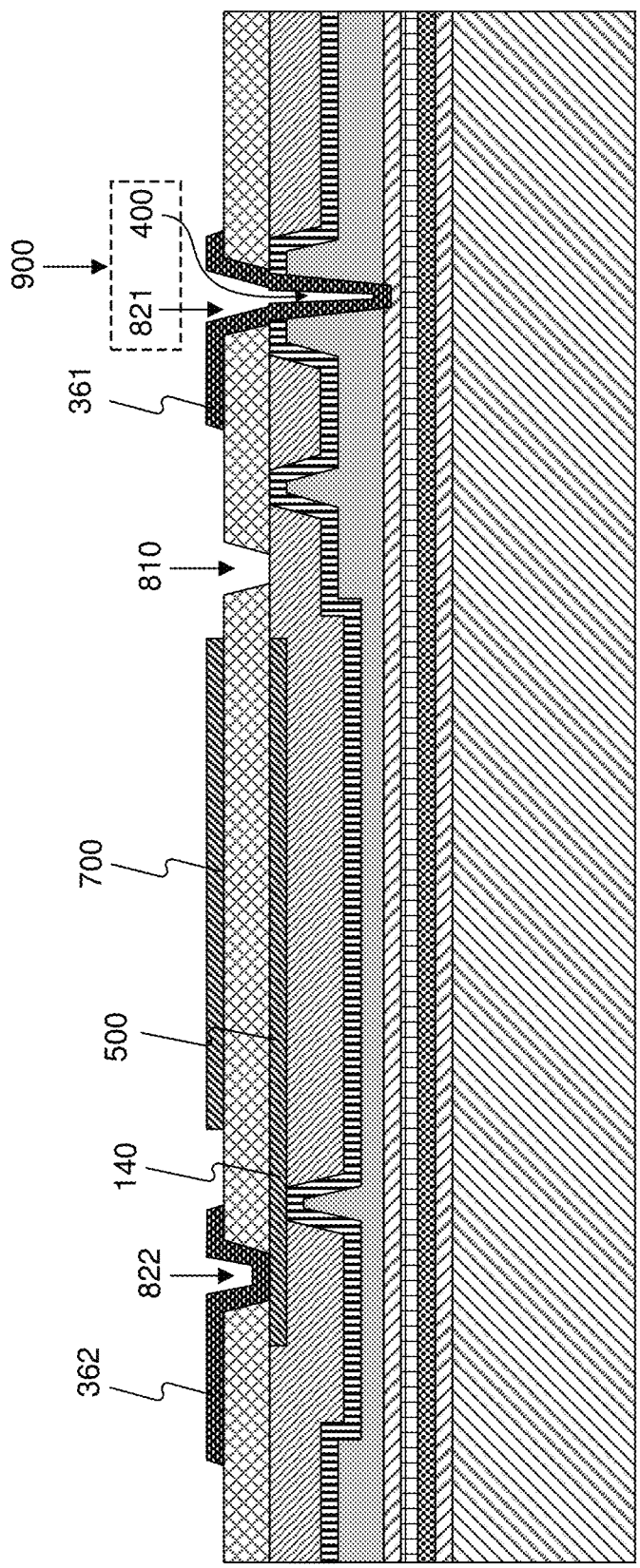

As illustrated in FIG. 6E, in step S17, a pad metal layer is formed on the structure of FIG. 6D, and the pad metal layer is patterned to form ground pad metal layer 361 and first electrode pad metal layer 362. Ground pad metal layer 361 is disposed on piezoelectric layer 140 and in grounded through hole 900, and contacts first adhesive layer 150 via grounded through hole 900. Ground pad metal layer 361 is used to electrically connect metal bonding layer 200 to ground. First electrode pad metal layer 362 is disposed on piezoelectric layer 140 and in contact hole 822, and contacts first portion 501 of first electrode 500 via contact hole 822. First electrode pad metal layer 362 is used for external electrical connection of BAW resonator 10.

Figure 6F:
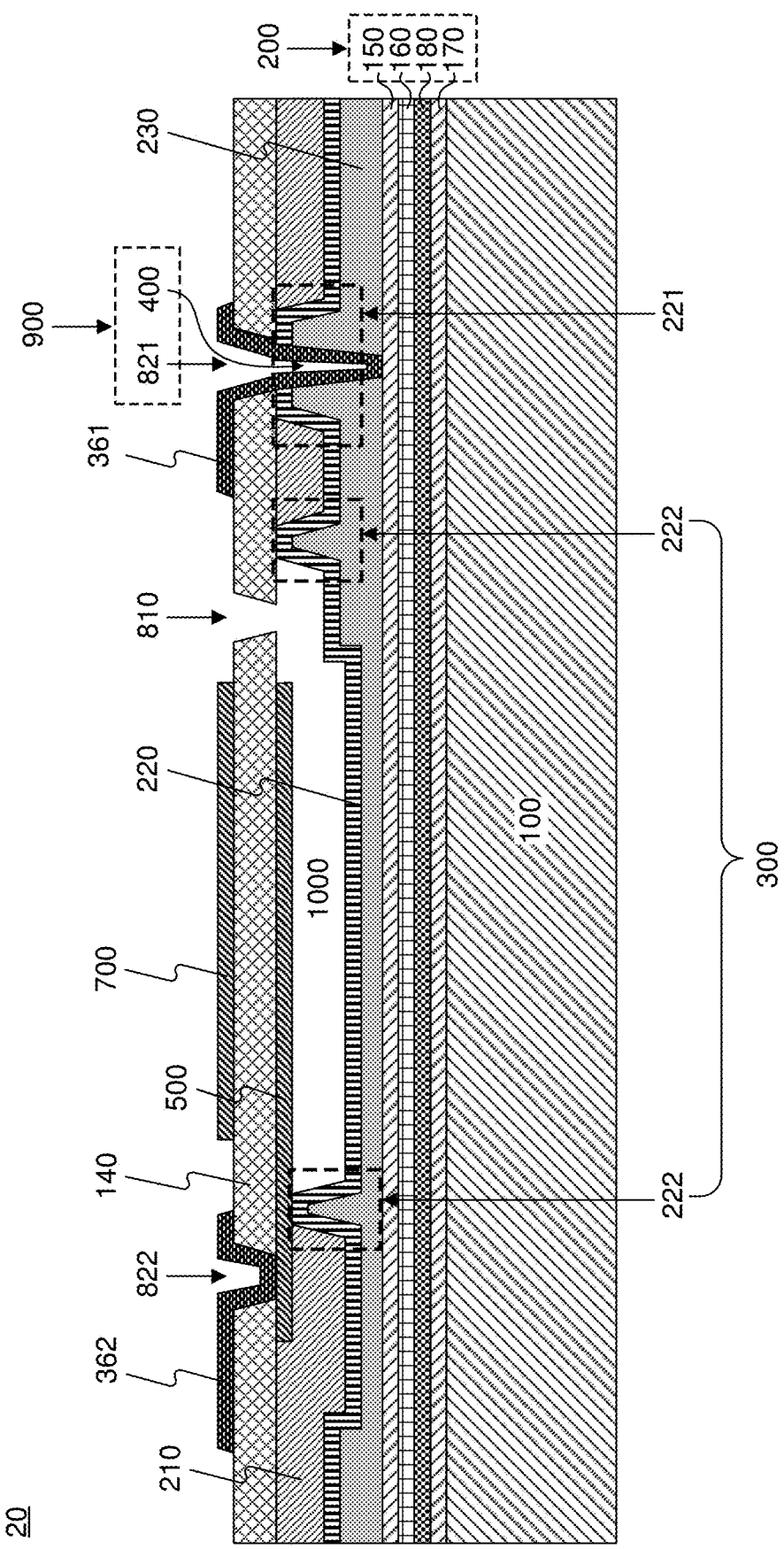

As illustrated in FIG. 6F, in step S18, the portion of first dielectric layer 210 surrounded by second double-wall protruding structure 222 is etched and removed to form cavity 1000. The etchant and etching product formed during the etching process is released via the one or more release holes 810. Thus, BAW resonator 20 illustrated in FIGS. 4A and 4B is fabricated.

Other embodiments of the disclosure will be apparent to those skilled in the art from consideration of the specification and practice of the disclosure disclosed herein. It is intended that the specification and examples be considered as exemplary only, with a true scope and spirit of the invention being indicated by the following claims.

What is claimed is:

1. A bulk acoustic wave (BAW) resonator, comprising:
a substrate;
a piezoelectric layer disposed above the substrate;
a first electrode disposed below the piezoelectric layer, and including a first portion and a second portion spaced apart from each other;
a second electrode disposed above the piezoelectric layer;
a first dielectric layer, a second dielectric layer, and a third dielectric layer sequentially disposed between the substrate and the piezoelectric layer in an order from the piezoelectric layer to the substrate;
a cavity disposed below the first portion of the first electrode;
a first grounded through hole disposed in the second dielectric layer and the third dielectric layer and exposing a first surface of the second portion of the first electrode;
a metal bonding layer disposed between the third dielectric layer and the substrate, with a portion of the metal bonding layer being disposed in the first grounded through hole;
a second grounded through hole disposed in the piezoelectric layer and exposing a second surface of the second portion of the first electrode; and
a ground pad metal layer disposed on the piezoelectric layer, with a portion of the ground pad metal layer being disposed in the second grounded through hole, wherein the portion of the ground pad metal layer in the second grounded through hole is electrically connected to the portion of the metal bonding layer in the first grounded through hole, via the second portion of the first electrode.

2. The BAW resonator of claim 1, wherein the first grounded through hole is not vertically aligned with the second grounded through hole.

3. The BAW resonator of claim 1, wherein:
the metal bonding layer includes a first adhesive layer, a first bonding layer, a second adhesive layer, and a second bonding layer, and
the second bonding layer bonds to the first bonding layer by eutectic bonding or metal diffusion bonding.

4. The BAW resonator of claim 3, wherein the first adhesive layer and the second adhesive layer are formed of one of chromium (Cr), titanium (Ti), titanium nitride (TiN), titanium tungsten (TiW), tantalum (Ta), tantalum nitride (TaN), or a stacked combination of two or more of those materials.

5. The BAW resonator of claim 3, wherein the first bonding layer and the second bonding layer are formed of one of gold (Au), copper (Cu), aluminum (Al), indium (In), nickel (Ni), tin (Sn), or a stacked combination of two or more of those materials.

6. The BAW resonator of claim 3, wherein:
the second dielectric layer includes a first double-wall protruding structure protruding through the first dielectric layer toward the piezoelectric layer and contacting a first surface of the second portion of the first electrode,
the third dielectric layer fills in the first double-wall protruding structure,
the first grounded through hole is disposed in the first double-wall protruding structure,
the first adhesive layer overlays the third dielectric layer, covers sidewalls and a bottom of the first grounded through hole, and contacts the first surface of the second portion of the first electrode via the first grounded through hole,
the first bonding layer overlays the first adhesive layer,
the second adhesive layer is disposed on a surface of the substrate facing the piezoelectric layer.

7. The BAW resonator of claim 6, wherein the second dielectric layer includes a second double-wall protruding structure protruding through the first dielectric layer toward the piezoelectric layer and surrounding the cavity,
the second double-wall protruding structure contacts a portion of the piezoelectric layer and a portion of the first portion of the first electrode, and
the third dielectric layer fills in the second double-wall protruding structure.

8. The BAW resonator of claim 6, further comprising at least one of:
the first dielectric layer formed of silicon oxide;
the second dielectric layer formed of polysilicon, amorphous silicon, silicon nitride, aluminum nitride, gallium nitride, tantalum nitride, or a stacked combination of two or more of those materials; or
the third dielectric layer formed of silicon oxide, silicon nitride, aluminum nitride, or a stacked combination of two or more of those materials.

9. The BAW resonator of claim 1, further comprising:
a contact hole in the piezoelectric layer, and exposing the first portion of the first electrode; and
a first electrode pad metal layer disposed on the piezoelectric layer and in the contact hole, and contacts the first portion of the first electrode via the contact hole.

10. A bulk acoustic wave (BAW) resonator, comprising:
a substrate;
a piezoelectric layer disposed above the substrate;
a first electrode disposed below the piezoelectric layer;
a second electrode disposed above the piezoelectric layer;
a first dielectric layer, a second dielectric layer, and a third dielectric layer sequentially disposed between the substrate and the piezoelectric layer in an order from the piezoelectric layer to the substrate;
a cavity disposed below the first electrode;
a metal bonding layer disposed between the third dielectric layer and the substrate;
a grounded through hole disposed in the piezoelectric layer, the second dielectric layer, and the third dielectric layer, and exposing the metal bonding layer; and
a ground pad metal layer disposed on the piezoelectric layer and in the grounded through hole, and electrically connected to the metal bonding layer.

11. The BAW resonator of claim 10, wherein:
the metal bonding layer includes a first adhesive layer, a first bonding layer, a second adhesive layer, and a second bonding layer, and
the second bonding layer bonds to the first bonding layer by eutectic bonding or metal diffusion bonding.

12. The BAW resonator of claim 11, wherein the first adhesive layer and the second adhesive layer are formed of one of chromium (Cr), titanium (Ti), titanium nitride (TiN), titanium tungsten (TiW), tantalum (Ta), tantalum nitride (TaN), or a stacked combination of two or more of those materials.

13. The BAW resonator of claim 11, wherein the first bonding layer and the second bonding layer are formed of one of gold (Au), copper (Cu), aluminum (Al), indium (In), nickel (Ni), tin (Sn), or a stacked combination of two or more of those materials.

14. The BAW resonator of claim 11, wherein:
the second dielectric layer includes a first double-wall protruding structure protruding through the first dielectric layer toward the piezoelectric layer and contacting a first surface of the piezoelectric layer, the first double-wall protruding structure being spaced apart from the cavity,
the third dielectric layer fills in the first double-wall protruding structure,
the first adhesive layer is disposed below and contacts the third dielectric layer,
the first bonding layer is disposed below the first adhesive layer,
the second adhesive layer is disposed on a surface of the substrate facing the piezoelectric layer,
the second bonding layer is disposed on the second adhesive layer and bonds to the first bonding layer by eutectic bonding or metal diffusion bonding, and
the grounded through hole includes a first grounded through hole disposed in the first double-wall protruding structure and exposes the first adhesive layer and a second grounded through hole disposed in the piezoelectric layer and aligned with the first grounded through hole.

15. The BAW resonator of claim 14, wherein:
the second dielectric layer includes a second double-wall protruding structure protruding through the first dielectric layer toward the piezoelectric layer and surrounding the cavity,
the second double-wall protruding structure contacts a portion of the piezoelectric layer and a portion of the first electrode, and
the third dielectric layer fills in the second double-wall protruding structure.

16. The BAW resonator of claim 14, wherein the first dielectric layer is formed of silicon oxide.

17. The BAW resonator of claim 14, wherein the second dielectric layer is formed of polysilicon, amorphous silicon, silicon nitride, aluminum nitride, gallium nitride, tantalum nitride, or a stacked combination of two or more of those materials.

18. The BAW resonator of claim 14, wherein the third dielectric layer is formed of silicon oxide, silicon nitride, aluminum nitride, or a stacked combination of two or more of those materials.

19. The BAW resonator of claim 10, further comprising:
one or more release holes formed in the piezoelectric layer, and exposing the cavity.

20. The BAW resonator of claim 10, further comprising:
a contact hole in the piezoelectric layer, and exposing a portion of the first electrode; and
a first electrode pad metal layer disposed on the piezoelectric layer and in the contact hole, and contacts the first electrode via the contact hole.

* * * * *